(12) United States Patent
Tamaki et al.

(10) Patent No.: US 10,057,502 B2
(45) Date of Patent: Aug. 21, 2018

(54) PHOTOSENSOR AND IMAGING DEVICE

(71) Applicant: Panasonic Intellectual Property Management Co., Ltd., Osaka (JP)

(72) Inventors: Tokuhiko Tamaki, Osaka (JP); Takeyoshi Tokuhara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 8 days.

(21) Appl. No.: 15/442,078

(22) Filed: Feb. 24, 2017

(65) Prior Publication Data

US 2017/0272662 A1 Sep. 21, 2017

(30) Foreign Application Priority Data

Mar. 17, 2016 (JP) .................. 2016-053982

(51) Int. Cl.
  *H04N 5/243* (2006.01)
  *H01L 27/146* (2006.01)
  *H04N 5/378* (2011.01)
  *H04N 5/369* (2011.01)

(52) U.S. Cl.
  CPC ....... *H04N 5/243* (2013.01); *H01L 27/14612* (2013.01); *H01L 27/14627* (2013.01); *H01L 27/14636* (2013.01); *H01L 27/14643* (2013.01); *H04N 5/3698* (2013.01); *H04N 5/378* (2013.01)

(58) Field of Classification Search
  CPC .............................. H04N 5/243; H04N 5/3698
  See application file for complete search history.

(56) References Cited

U.S. PATENT DOCUMENTS

| 6,887,731 | B2 * | 5/2005 | Nakayama | G02F 1/134363 257/141 |
| 8,023,025 | B2 * | 9/2011 | Itano | H04N 5/335 348/308 |
| 9,747,841 | B2 * | 8/2017 | Kumeta | G09G 3/3291 |
| 2007/0194705 | A1 * | 8/2007 | Sung | H01L 27/3276 313/506 |

(Continued)

FOREIGN PATENT DOCUMENTS

| JP | 2004-134593 | 4/2004 |
| JP | 2011-060830 | 3/2011 |

(Continued)

*Primary Examiner* — Cynthia Segura
(74) *Attorney, Agent, or Firm* — McDermott Will & Emery LLP

(57) ABSTRACT

A photosensor includes a photoelectric converter including first and second electrodes and a photoelectric conversion layer therebetween; a transistor having a gate, a source and a drain; a connector electrically connecting the first electrode and the gate together; and one or more wiring layers including a part of the connector. The transistor outputs an electric signal from one of the source and the drain, the electric signal corresponding to a change in dielectric constant between the first electrode and the second electrode, the change being caused by incident light on the photoelectric conversion layer. The one or more wiring layers include a first line coupled to the one of the source and the drain and a second line supplied with a fixed voltage in a period during operation. A distance between the first line and the connector is less than a distance between the second line and the connector.

17 Claims, 20 Drawing Sheets

(56) References Cited

U.S. PATENT DOCUMENTS

| | | |
|---|---|---|
| 2011/0049591 A1 | 3/2011 | Nakatani et al. |
| 2014/0043510 A1 | 2/2014 | Kasuga et al. |
| 2015/0103219 A1* | 4/2015 | Kasuga ................ H04N 5/363 348/300 |
| 2017/0263669 A1* | 9/2017 | Tamaki ............. H01L 27/14614 |
| 2017/0328776 A1* | 11/2017 | Shimasaki ............ G01J 5/0853 |
| 2017/0331062 A1* | 11/2017 | Tamaki ................ H01L 51/428 |

FOREIGN PATENT DOCUMENTS

| | | |
|---|---|---|
| JP | 2011-071481 | 4/2011 |
| WO | 2012/147302 | 11/2012 |

* cited by examiner

US 10,057,502 B2

PHOTOSENSOR AND IMAGING DEVICE

BACKGROUND

1. Technical Field

The present disclosure relates to a photosensor. The present disclosure also relates to an imaging device.

2. Description of the Related Art

Photodetectors and image sensors include photodetector elements. Typical examples of photodetector elements include photoelectric conversion elements, such as photodiodes and phototransistors. As well known, light can be detected by detecting photocurrent caused by light irradiation in a photoelectric conversion element.

Japanese Unexamined Patent Application Publication No. 2011-60830 discloses in FIG. 2a thin-film transistor (TFT) including an organic film containing a predetermined compound dispersed in an organic polymer as a gate-insulating film. The predetermined compound of the organic film is a compound that changes polarization upon light irradiation. In the thin-film transistor described in Japanese Unexamined Patent Application Publication No. 2011-60830, light irradiation on the gate-insulating film changes the dielectric constant of the gate-insulating film. Thus, light irradiation on the gate-insulating film changes the electric current flowing between the source and the drain. Japanese Unexamined Patent Application Publication No. 2011-60830 discloses that such a thin-film transistor can be used in a photosensor.

SUMMARY

One non-limiting and exemplary embodiment provides a photosensor having a novel structure.

In one general aspect, the techniques disclosed here feature a photosensor that includes a photoelectric converter including a first electrode, a second electrode facing the first electrode, and a photoelectric conversion layer between the first electrode and the second electrode; a first transistor having a first gate, a first source and a first drain; a connector electrically connecting the first electrode and the first gate together; one or more wiring layers between the first transistor and the photoelectric converter, the one or more wiring layers including a part of the connector, a first voltage supply circuit that supplies a first fixed voltage, and a first controller. The first transistor outputs an electric signal from one of the first source and the first drain, the electric signal corresponding to a change in dielectric constant between the first electrode and the second electrode, the change being caused by incident light on the photoelectric conversion layer. The one or more wiring layers include a first line and a second line, the first line being coupled to the one of the first source and the first drain. The first controller causes the first voltage supply circuit to supply the first fixed voltage to the second line in a first period during operation. A distance between the first line and the connector is less than a distance between the second line and the connector.

It should be noted that general or specific embodiments may be implemented as an element, a device, an apparatus, a system, an integrated circuit, or a method. It should be noted that general or specific embodiments may also be implemented as any selective combination of an element, a device, an apparatus, a system, an integrated circuit, and a method.

The benefits and/or advantages may be individually obtained by the various embodiments and features of the specification and drawings, which need not all be provided in order to obtain one or more of such benefits and/or advantages.

DETAILED DESCRIPTION

Figure 1:
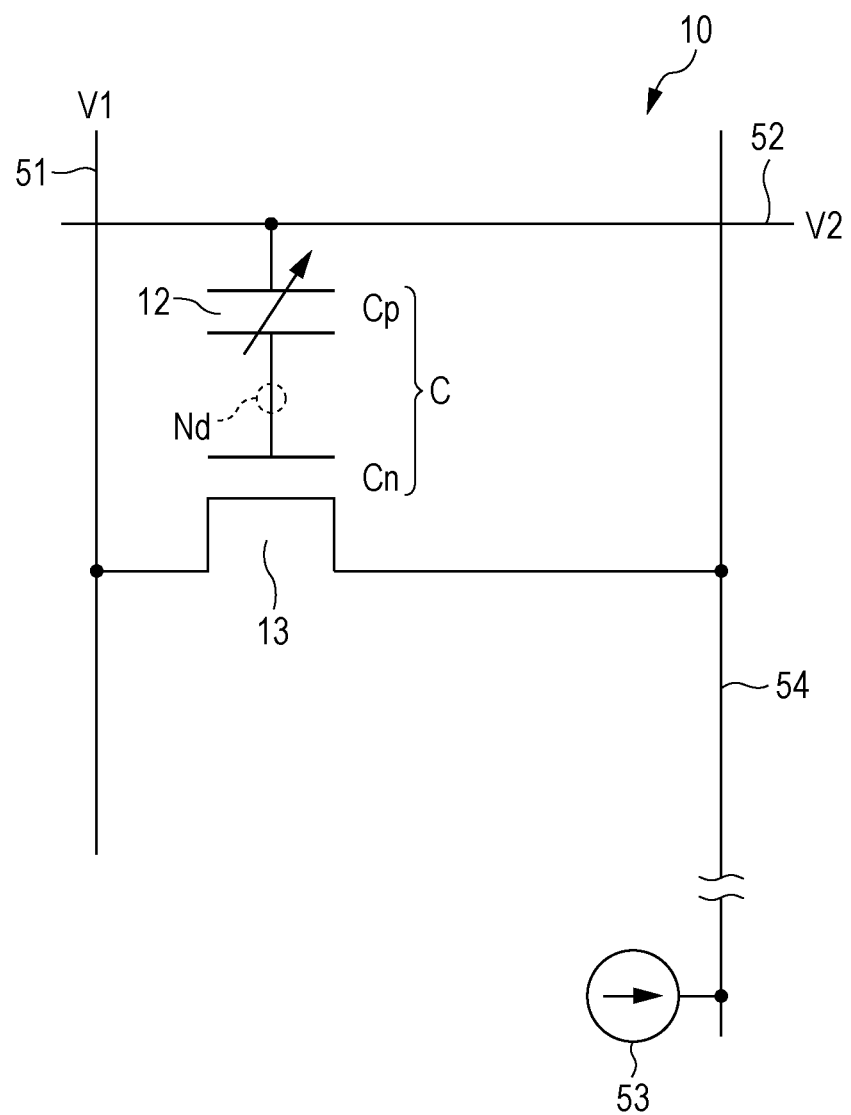
FIG. 1 is a schematic circuit diagram of a photosensor according to a first embodiment of the present disclosure.

One aspect of the present disclosure will be described below.

[Item 1]

A photosensor comprising:

a photoelectric converter including a first electrode, a second electrode facing the first electrode, and a photoelectric conversion layer between the first electrode and the second electrode;

a first transistor having a first gate, a first source and a first drain;

a connector electrically connecting the first electrode and the first gate together;

one or more wiring layers between the first transistor and the photoelectric converter, the one or more wiring layers including a part of the connector, a first voltage supply circuit that supplies a first fixed voltage, and a first controller, wherein the first transistor outputs an electric signal from one of the first source and the first drain, the electric signal corresponding to a change in dielectric constant between the first electrode and the second electrode, the change being caused by incident light on the photoelectric conversion layer, the one or more wiring layers include a first line and a second line, the first line being coupled to the one of the first source and the first drain, the first controller causes the first voltage supply circuit to supply the first fixed voltage to the second line in a first period during operation, and a distance between the first line and the connector is less than a distance between the second line and the connector.

[Item 2]

The photosensor according to Item 1, wherein the second line is coupled to the other of the first source and the first drain.

[Item 3]

The photosensor according to Item 1, further comprising a second transistor having a second gate, a second source and a second drain, one of the second source and the second drain being coupled to the one of the first source and the first drain, the other of the second source and the second drain being coupled to the first line, wherein the first line is coupled to the one of the first source and the first drain via the second transistor.

[Item 4]

The photosensor according to Item 3, wherein the second line is coupled to the other of the first source and the first drain.

[Item 5]

The photosensor according to Item 3, wherein the second line is coupled to the second gate.

[Item 6]

The photosensor according to Item 4, comprising a second voltage supply circuit that supplies a second fixed voltage, and a second controller, wherein the one or more wiring layers further include a third line, the second controller causes the second voltage supply circuit to supply the second fixed voltage to the third line in a second period during operation, the third line is coupled to the second gate, and a distance between the first line and the connector is less than a distance between the third line and the connector.

[Item 7]

The photosensor according to Item 1, further comprising a second transistor having a second gate, a second source and a second drain, one of the second source and the second drain being coupled to the one of the first source and the first drain, wherein the first line is coupled to the one of the second source and the second drain, and the second line is coupled to the second gate.

[Item 8]

The photosensor according to Item 1, further comprising a second transistor having a second gate, a second source and a second drain, one of the second source and the second drain being coupled to the other of the first source and the first drain.

[Item 9]

The photosensor according to Item 8, wherein the second line is coupled to the other of the second source and the second drain.

[Item 10]

The photosensor according to Item 8, wherein the second line is coupled to the second gate.

[Item 11]

The photosensor according to Item 9, comprising a second voltage supply circuit that supplies a second fixed voltage, and a second controller, wherein the one or more wiring layers further include a third line, the second controller causes the second voltage supply circuit to supply the second fixed voltage to the third line in a second period during operation, the third line is coupled to the second gate, and a distance between the first line and the connector is less than a distance between the third line and the connector.

[Item 12]

The photosensor according to any one of Items 1 to 11, wherein the first line is between the part of the connector and the second line.

[Item 13]

The photosensor according to Item 6 or 11, wherein the first line is between the part of the connector and the third line.

[Item 14]

The photosensor according to any one of Items 1 to 13, wherein the first line surrounds the part of the connector in a plan view.

[Item 15]

The photosensor according to any one of Items 1 to 14, comprising a second voltage supply circuit, wherein the photoelectric conversion layer has a photocurrent characteristic between a bias voltage and an output current density, the photocurrent characteristic including a first voltage range where an absolute value of the output current density increases as the bias voltage increases in a reverse direction, a second voltage range where the output current density increases as the bias voltage increases in a forward direction, and a third voltage range where an absolute value of a change rate of the output current density relative to the bias voltage is less than in the first voltage range and the second voltage range, the third voltage range being a voltage range between the first voltage range and the second voltage range, and the first transistor outputs the electric signal in a state where the second voltage supply circuit applies a first bias voltage within the third voltage range to the photoelectric conversion layer.

[Item 16]

An imaging device comprising a plurality of pixel cells each including the photosensor according to Items 1 to 15, wherein the plurality of pixel cells are arranged one-dimensionally or two-dimensionally.

[Item 17]

A photosensor including
a photoelectric converter that includes a first electrode, a light-transmitting second electrode, and a photoelectric conversion layer disposed between the first electrode and the second electrode,
a first field-effect transistor including a gate electrode,
a connector that electrically connects the first electrode to the gate electrode, and
a wiring layer disposed between the first electrode and the gate electrode and including an output signal line electrically connected to one of a source and a drain of the first field-effect transistor and including a first fixed voltage line having a fixed electric potential during operation,
wherein the wiring layer includes part of the connector,
at least part of the output signal line is disposed between the part of the connector and the first fixed voltage line, and
the first field-effect transistor outputs an electric signal to the output signal line, the electric signal corresponding to a change in dielectric constant between the first electrode and the second electrode caused by incidence of light on the photoelectric conversion layer via the second electrode.

The structure according to Item 17 can suppress the decrease in sensitivity resulting from electrical coupling between the connector and the voltage line having a fixed electric potential during operation.

[Item 18]

The photosensor according to Item 17, wherein the first fixed voltage line is electrically connected to the other of the source and drain of the first field-effect transistor.

[Item 19]

A photosensor including
a photoelectric converter that includes a first electrode, a light-transmitting second electrode, and a photoelectric conversion layer disposed between the first electrode and the second electrode,
a first field-effect transistor including a gate electrode,
a connector that electrically connects the first electrode to the gate electrode,
a first fixed voltage line having a fixed electric potential during operation, and
a wiring layer disposed between the first electrode and the gate electrode and including an output signal line electrically connected to one of a source and a drain of the first field-effect transistor and including a second fixed voltage line having the same electric potential as the first fixed voltage line,
wherein the first fixed voltage line is electrically connected to the other of the source and drain of the first field-effect transistor,
the wiring layer includes part of the connector,
at least part of the output signal line is disposed between the part of the connector and the second fixed voltage line, and
the first field-effect transistor outputs an electric signal to the output signal line, the electric signal corresponding to a change in dielectric constant between the first electrode and the second electrode caused by incidence of light on the photoelectric conversion layer via the second electrode.

The structure according to Item 19 has substantially the same advantages as the structure according to Item 17.

[Item 20]

The photosensor according to Item 19, wherein
the wiring layer includes the first fixed voltage line, and
the at least part of the output signal line is disposed between the part of the connector and the first fixed voltage line and between the part of the connector and the second fixed voltage line.

The structure according to Item 20 can suppress the decrease in sensitivity resulting from electrical coupling between the connector and the first voltage line and electrical coupling between the connector and the second fixed voltage line.

[Item 21]

A photosensor including
a photoelectric converter that includes a first electrode, a light-transmitting second electrode, and a photoelectric conversion layer disposed between the first electrode and the second electrode,
a first field-effect transistor including a first gate electrode,
a second field-effect transistor including a second gate electrode,
a connector that electrically connects the first electrode to the first gate electrode, and
a wiring layer disposed between the first electrode and the first gate electrode and including an output signal line electrically connected to one of a source and a drain of the first field-effect transistor via the second field-effect transistor and including an address signal line electrically connected to the second gate electrode of the second field-effect transistor,
wherein the second field-effect transistor is coupled between one of the source and drain of the first field-effect transistor and the output signal line,
the wiring layer includes part of the connector,
at least part of the output signal line is disposed between the part of the connector and the address signal line, and
the first field-effect transistor outputs an electric signal to the output signal line via the second field-effect transistor, the electric signal corresponding to a change in dielectric constant between the first electrode and the second electrode caused by incidence of light on the photoelectric conversion layer via the second electrode.

The structure according to Item 21 can suppress the decrease in sensitivity resulting from electrical coupling between the connector and the address signal line.

[Item 22]

The photosensor according to Item 21, further including a fixed voltage line electrically connected to the other of the source and drain of the first field-effect transistor and having a fixed electric potential during operation.

[Item 23]

The photosensor according to Item 22, wherein
the wiring layer includes the fixed voltage line, and
the at least part of the output signal line is disposed between the part of the connector and the address signal line and between the part of the connector and the fixed voltage line.

The structure according to Item 23 can more effectively suppress the decrease in sensitivity.

[Item 24]

The photosensor according to Item 22, wherein part of the output signal line is disposed between the part of the connector and the address signal line, and another part of the output signal line is disposed between the part of the connector and the fixed voltage line.

The structure according to Item 24 can suppress the decrease in sensitivity resulting from electrical coupling between the connector and the address signal line and electrical coupling between the connector and the fixed voltage line.

[Item 25]

The photosensor according to any one of Items 17 to 24, wherein the photoelectric conversion layer has photocurrent characteristics in which the rate of change in output current density with bias voltage varies in a first voltage range, a second voltage range, and a third voltage range between the first voltage range and the second voltage range, the absolute output current density increasing with reverse bias voltage in the first voltage range, the output current density increasing with forward bias voltage in the second voltage range, the rate of change in the third voltage range is smaller than the rate of change in the first voltage range and the rate of change in the second voltage range, and while the potential difference between the second electrode and the other of the source and drain of the first field-effect transistor is maintained in the third voltage range, light incident on the photoelectric conversion layer via the second electrode is detected as an electric signal from one of the source and drain of the first field-effect transistor corresponding to a change in dielectric constant.

[Item 26]

An imaging device including a plurality of pixel cells each including the photosensor according to any one of Items 17 to 25.

The structure according to Item 26 provides an imaging device that can suppress the decrease in sensitivity resulting from electrical coupling between the connector and the voltage line having a fixed electric potential during operation in each pixel cell.

Embodiments of the present disclosure will be described in detail below with reference to the accompanying drawings. The following embodiments are general or specific examples. The numerical values, shapes, materials, components, arrangement and connection of the components, steps, and sequential order of steps in the following embodiments are only examples and are not intended to limit the present disclosure. Various aspects described herein can be combined as long as there is no contradiction. Among the components in the following embodiments, components not described in the highest level concepts of the independent claims are described as optional components. In the following description, like components having substantially the same function are denoted by common reference numerals and may not be further described.

First Embodiment

FIG. 1 illustrates a photosensor according to a first embodiment of the present disclosure. As schematically illustrated in FIG. 1, roughly speaking, a photosensor 10 according to the first embodiment of the present disclosure includes a photoelectric converter 12 and a signal detection transistor 13. The signal detection transistor 13 is typically a field-effect transistor (FET) and is an N-channel MOS, for example. In the following description, unless otherwise specified, the other transistors are also N-channel MOSs. The photoelectric converter 12 is electrically connected to a gate of the signal detection transistor 13. In the following description, a node between the photoelectric converter 12 and the signal detection transistor 13 is sometimes referred to as a "node Nd".

In the structure illustrated in FIG. 1, one of the source and drain (the drain in the present embodiment) of the signal detection transistor 13 is coupled to a first voltage line 51. When the photosensor 10 operates, the first voltage line 51 sends a certain voltage (first bias voltage V1) to the signal detection transistor 13 (the drain of the signal detection transistor 13 in the present embodiment). The other of the source and drain (the source in the present embodiment) of the signal detection transistor 13 is coupled to an output signal line 54, which is coupled to a constant-current source 53.

As described in detail below with reference to the accompanying drawings, the photoelectric converter 12 includes two electrodes and a photoelectric conversion layer between these electrodes. One of the two electrodes on opposite sides of the photoelectric conversion layer is electrically connected to the gate of the signal detection transistor 13. The other electrode is coupled to a second voltage line 52, which sends a predetermined voltage (second bias voltage V2) when the photosensor 10 operates. As described later, light is detected under a predetermined bias applied between the main surfaces of the photoelectric conversion layer of the photoelectric converter 12.

The photoelectric conversion layer of the photoelectric converter 12 generates positive and negative charge upon light irradiation. As described later, when the potential difference between the two main surfaces of the photoelectric conversion layer is within a predetermined range, almost no electric charge is transferred between the photoelectric conversion layer and the electrodes disposed on opposite sides of the photoelectric conversion layer. Thus, when the bias applied to the photoelectric conversion layer is within a predetermined range, the photoelectric converter 12 can be considered to be a capacitive element. As described in detail below, when a positive and negative charge pair is generated in the photoelectric conversion layer upon light irradiation on the photoelectric conversion layer under a predetermined bias applied between the main surfaces, this changes the dielectric constant between the two electrodes on opposite sides of the photoelectric conversion layer. In other words, the capacitance Cp of the photoelectric converter 12 depends on the illuminance of the photosensor 10. Since the capacitance Cp depends on the illuminance of the photosensor 10, the photoelectric converter 12 in FIG. 1 is represented by a circuit symbol of variable capacitors.

If the photoelectric converter 12 is assumed to be part of the gate of the signal detection transistor 13, the gate of the signal detection transistor 13 can include the series connection of the capacitance of a gate-insulating layer and the capacitance of the photoelectric converter 12. More specifically, if the combination of the photoelectric converter 12 and the signal detection transistor 13 is assumed to be a single field-effect transistor, the gate capacitance C of the single field-effect transistor is represented by $C=(C_p \times C_n/(C_p+C_n))$. $C_n$ denotes the capacitance of the gate-insulating layer of the signal detection transistor 13.

It is known that the threshold voltage of field-effect transistors is inversely proportional to the gate capacitance. Since the capacitance $C_p$ of the photoelectric converter 12 depends on the illuminance of the photosensor 10, the capacitance C also depends on the illuminance of the photosensor 10. In other words, upon light irradiation on the photoelectric converter 12, due to the same effects as a change in the gate capacitance of field-effect transistors, the threshold voltage of the signal detection transistor 13 also depends on illuminance. It is therefore possible to utilize the dependency to detect light.

In this embodiment, since the output signal line 54 is connected to the constant-current source 53, a change in the source voltage of the signal detection transistor 13 due to light irradiation on the photosensor 10 can be detected as a change in the voltage of the output signal line 54. In other words, light can be detected on the basis of a change in the voltage of the output signal line 54. In this case, the first voltage line 51 functions as a source follower power supply. Light may be detected by detecting an electric current outputted from the signal detection transistor 13, instead of voltage. For example, the output signal line 54 may be coupled to a constant voltage source, and a change in the electric current of the output signal line 54 may be detected. However, detection of a change in voltage can be advantageously performed by using processes and circuits of photosensors including silicon photodiodes and can advantageously achieve a high S/N ratio.

Device Structure of Photosensor 10

Figure 2:
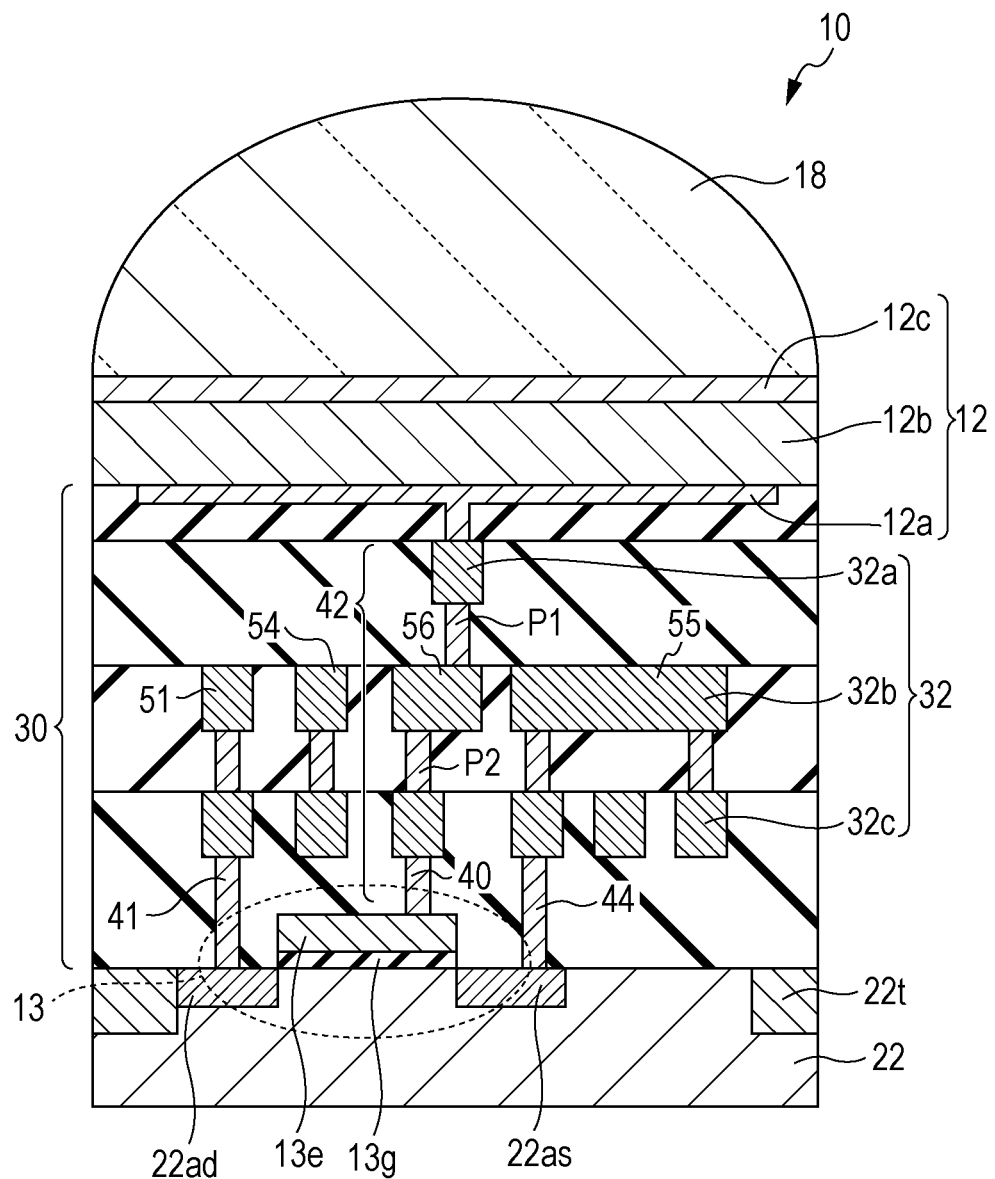
FIG. 2 is a schematic cross-sectional view of a typical device structure of a photosensor.

FIG. 2 schematically illustrates a typical device structure of the photosensor 10. FIG. 2 simply illustrates the arrangement of the components of the photosensor 10, and the components are not necessarily illustrated in their actual sizes. The same is true for the other drawings in the present disclosure.

In the structure illustrated in FIG. 2, the photosensor 10 includes a semiconductor substrate 22 on which the signal detection transistor 13 is disposed. The semiconductor substrate 22 is a p-type silicon (Si) substrate, for example. The semiconductor substrate 22 can include an element isolation region 22t, which electrically isolates the signal detection transistor 13 from the other circuits on the semiconductor substrate 22. The term "semiconductor substrate", as used herein, refers not only to a substrate composed entirely of a semiconductor but also to an insulating substrate including a semiconductor layer on a light irradiation surface.

In the structure illustrated in FIG. 2, the semiconductor substrate 22 is covered with an interlayer insulating layer 30, and the photoelectric converter 12 is disposed on the interlayer insulating layer 30. The photoelectric converter 12 includes a pixel electrode 12a disposed on the interlayer insulating layer 30, a transparent electrode 12c, and a photoelectric conversion layer 12b disposed between the pixel electrode 12a and the transparent electrode 12c.

The pixel electrode 12a is typically a metal electrode or a metal nitride electrode. Examples of the material of the pixel electrode 12a include Al, Cu, Ti, TiN, Ta, TaN, Mo, Ru, and Pt. The pixel electrode 12a may be formed of conductive polysilicon doped with an impurity. In the present embodiment, the pixel electrode 12a is a TiN electrode. If the pixel electrode 12a is a light-shielding electrode, the pixel electrode 12a can reduce the incidence of stray light on a channel region of a transistor (for example, the signal detection transistor 13) disposed on the semiconductor substrate 22.

The transparent electrode 12c is disposed on an incident surface of the two main surfaces of the photoelectric conversion layer 12b in the photoelectric converter 12. Thus, light incident on the photosensor 10 and transmitted through the transparent electrode 12c is incident on the photoelectric conversion layer 12b. Light detectable by the photosensor 10 is not limited to light in the visible light region (for example, 380 to 780 nm). In the present specification, all electromagnetic waves, including infrared light and ultraviolet light, are referred to as "light" for convenience. The terms "transparent" and "light-transmitting", as used herein, refer to transmission of at least part of light in a wavelength range to be detected and do not necessarily mean transmission of light in the entire visible light region.

When the photosensor 10 is used as an infrared sensor, the material of the transparent electrode 12c can be a transparent conducting oxide (TCO) having high near-infrared light transmittance and low resistance. Examples of such a TCO include indium-tin oxide (ITO), indium-doped zinc oxide (IZO), aluminum-doped zinc oxide (AZO), fluorine-doped tin oxide (FTO), $SnO_2$, $TiO_2$, and $ZnO_2$. The transparent electrode 12c may be a thin metal film, such as Au.

The transparent electrode 12c is coupled to the second voltage line 52 (not shown in FIG. 2) and is configured to receive a predetermined voltage (second bias voltage) when the photosensor 10 operates. As illustrated in FIG. 2, a microlens 18 that condenses irradiation light and allows the irradiation light to be incident on the photoelectric conversion layer 12b may be disposed on the transparent electrode 12c. An infrared transmission filter and/or a protective layer may be disposed between the microlens 18 and the transparent electrode 12c.

The photoelectric conversion layer 12b between the transparent electrode 12c and the pixel electrode 12a has a thickness (a length in the direction normal to the semiconductor substrate 22) of approximately 200 nm, for example. The material of the photoelectric conversion layer 12b is typically a semiconductor material. In the present embodiment, the material of the photoelectric conversion layer 12b is an organic semiconductor material. A typical structure of the photoelectric conversion layer 12b will be described later. Upon receiving incident light through the transparent electrode 12c, the photoelectric conversion layer 12b generates positive and negative charge (typically, an electron-hole pair).

In the structure illustrated in FIG. 2, the interlayer insulating layer 30, which supports the photoelectric converter 12, has a multilayer structure including insulating layers (typically, silicon oxide films) and includes multilayer wiring 32. In the embodiment illustrated in FIG. 2, the interlayer insulating layer 30 includes four insulating layers, and the multilayer wiring 32 includes three wiring layers (wiring layers 32a, 32b, and 32c). The interlayer insulating layer 30 may include any number of insulating layers, and the multilayer wiring 32 may include any number of wiring layers.

Among the wiring layers 32a to 32c of the multilayer wiring 32, the wiring layer 32a farthest from the semiconductor substrate 22 is coupled to the pixel electrode 12a. The wiring layer 32a is coupled to the wiring layer 32b via the plug P1, and the wiring layer 32b is coupled to the wiring layer 32c closest to the semiconductor substrate 22 via the plug P2. The multilayer wiring 32 and the plugs P1 and P2 are formed of a metal, such as copper. The wiring layer(s) of the multilayer wiring 32 (for example, at least one of the wiring layers 32a to 32c) may form a light-shielding film.

The wiring layer 32c is coupled to the gate electrode 13e of the signal detection transistor 13 via a contact plug 40. The wiring layers 32a to 32c, the plugs P1 and P2, and the contact plug 40 constitute a connector 42 that electrically connects the pixel electrode 12a to the gate electrode 13e.

The signal detection transistor 13 includes the gate electrode 13e, a gate-insulating layer 13g disposed between the gate electrode 13e and the semiconductor substrate 22, and impurity regions (n-type regions in the present embodiment) 22ad and 22as disposed in the semiconductor substrate 22. Typically, the gate electrode 13e is a polysilicon electrode, and the gate-insulating layer 13g is a silicon thermal oxide film (silicon dioxide film). The gate-insulating layer 13g has a thickness of approximately 4.6 nm, for example. The gate-insulating layer 13g may be a high-dielectric-constant film (high-k film), such as a $HfO_2$ film. The gate-insulating layer 13g has a thickness depending on the material of the gate-insulating layer 13g.

The impurity region 22as functions as a source region of the signal detection transistor 13. In this embodiment, the impurity region 22as is coupled to a wire 55 via a contact plug 44. The wire 55 is part of the wiring layer 32b of the multilayer wiring 32. In other words, the wire 55 is in the same layer as the wiring layer 32b.

In the structure illustrated in FIG. 2, the wiring layer 32b includes the output signal line 54. For example, the output signal line 54 extends perpendicularly to the drawing and is electrically connected via a wire (not shown) to the wire 55 coupled to the impurity region 22as. Thus, the output signal line 54 and the wire 55 have the same electric potential and are in the same layer.

The impurity region 22ad in the semiconductor substrate 22 functions as a drain region of the signal detection transistor 13. In this embodiment, the impurity region 22ad is electrically connected to the first voltage line 51 via a contact plug 41. The first bias voltage V1 supplied to the impurity region 22ad via the first voltage line 51 may be a supply voltage VDD (for example, approximately 2.4 V).

A voltage in a predetermined range based on the electric potential of the drain of the signal detection transistor 13 is applied to the transparent electrode 12c. Thereby, a predetermined bias can be applied between one main surface of the photoelectric conversion layer 12b facing the pixel electrode 12a and the other main surface facing the transparent electrode 12c. When light is detected, the second bias voltage V2 supplied to the transparent electrode 12c via the second voltage line 52 is 2.5 V, for example. Thus, in this embodiment, when light is detected, a potential difference of approximately 0.1 V is applied between the two main surfaces of the photoelectric conversion layer 12b.

Light irradiation on the photoelectric conversion layer 12b in a biased state changes the dielectric constant between the pixel electrode 12a and the transparent electrode 12c. A change in dielectric constant between the pixel electrode 12a and the transparent electrode 12c due to light irradiation causes a change in the effective gate voltage of the signal detection transistor 13 including the gate electrode 13e electrically connected to the pixel electrode 12a. The signal detection transistor 13 outputs electric signals to the output signal line 54, the electric signals corresponding to a change in dielectric constant between the pixel electrode 12a and the transparent electrode 12c caused by light irradiation on the photoelectric converter 12.

In the embodiment illustrated in FIG. 2, the output signal line 54 and the first voltage line 51 are part of the wiring layer 32b in the multilayer wiring 32, that is, in the same layer. In the structure illustrated in FIG. 2, at least part of the output signal line 54 is disposed between a connector 56 and the first voltage line 51 in the wiring layer 32b. The connector 56 couples the plugs P1 and P2 together. As described below, the output signal line 54 closer to the connector 42 than the first voltage line 51 can be more strongly electrically connected to the connector 42 than the first voltage line 51, to which a certain voltage is applied when the photosensor 10 operates. This can produce the same effects as a substantially decreased parasitic capacitance of the node Nd between the photoelectric converter 12 and the signal detection transistor 13. Thus, a change in dielectric constant between the pixel electrode 12a and the transparent electrode 12c due to light irradiation can be more efficiently converted into a change in the threshold voltage of the signal detection transistor 13.

Coupling Between Connector 42 and Output Signal Line 54

The effect of suppressing the decrease in sensitivity due to electrical coupling between the connector 42 and the output signal line 54 will be described below with reference to the accompanying drawings.

Figure 3:
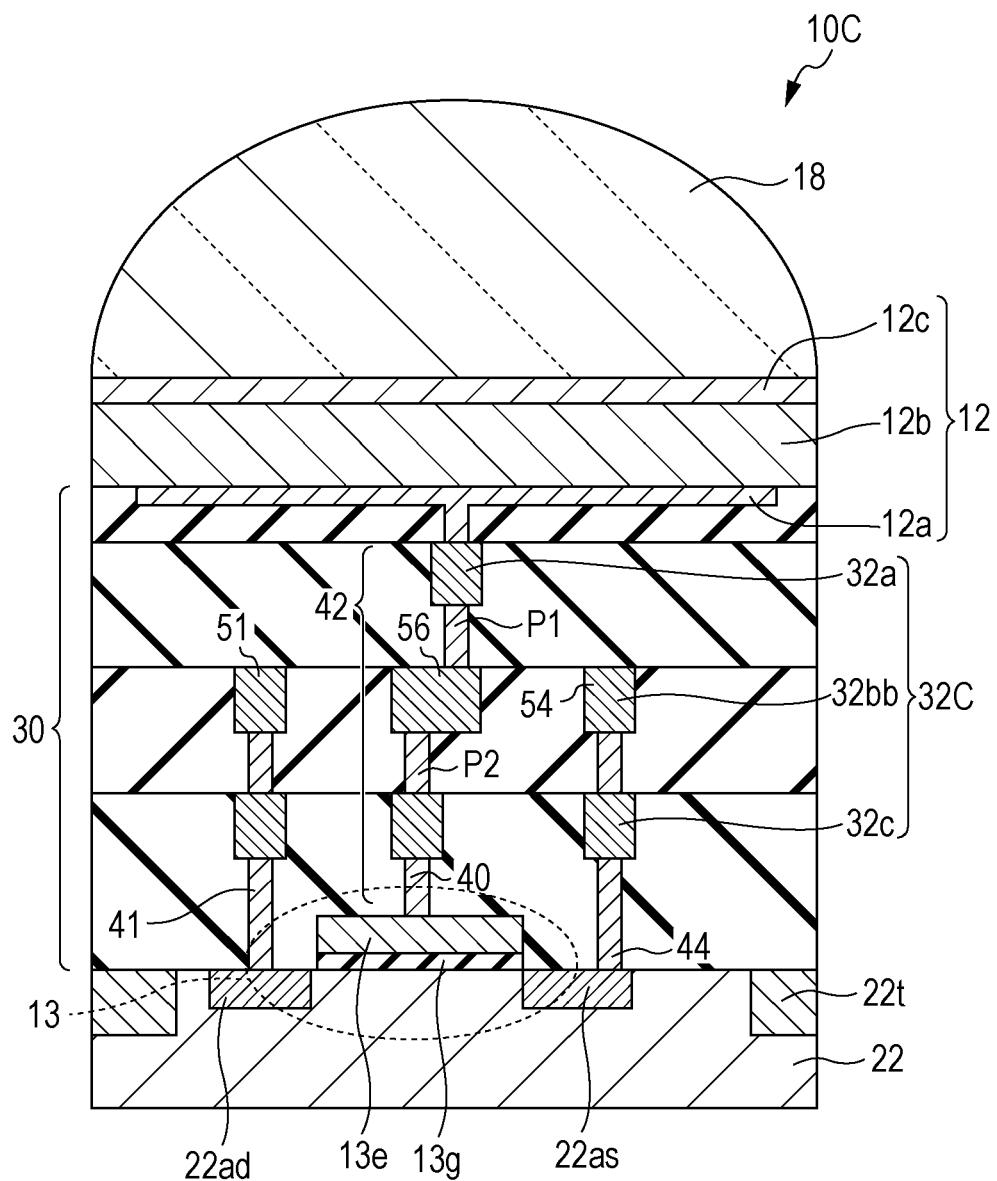
FIG. 3 is a schematic cross-sectional view of a device structure of a photosensor according to a comparative example.
Figure 4:
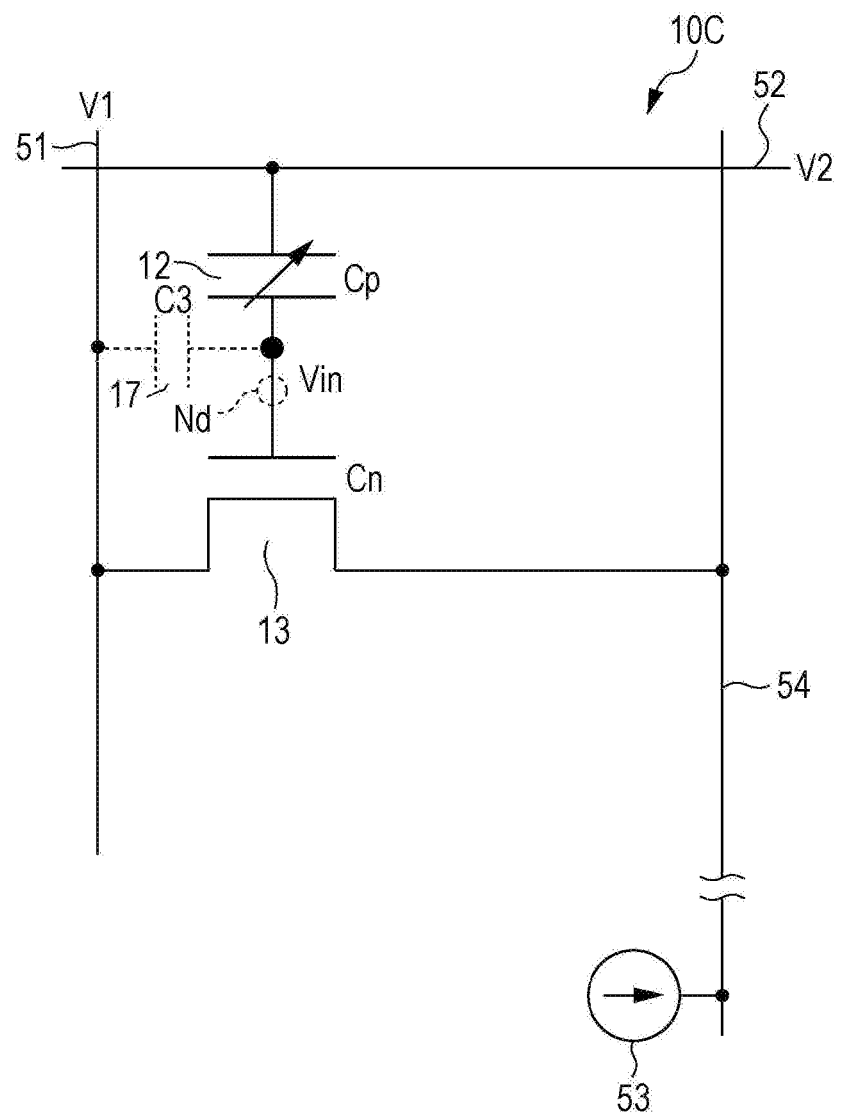
FIG. 4 is an equivalent circuit diagram of the photosensor illustrated in FIG. 3.

FIG. 3 schematically illustrates a device structure of a photosensor 10C according to a comparative example. FIG. 4 is an equivalent circuit diagram of the photosensor 10C illustrated in FIG. 3. Multilayer wiring 32C in the photosensor 10C according to the comparative example illustrated in FIG. 3 includes wiring layers 32a, 32bb, and 32c.

The node Nd between the photoelectric converter 12 and the signal detection transistor 13 has parasitic capacitance due to electrical coupling between electrodes in the photosensor 10C and wires in the multilayer wiring 32C. In the embodiment illustrated in FIG. 3, the wiring layer 32bb includes the connector 56 between the plugs P1 and P2 in the connector 42, and the output signal line 54 and the first voltage line 51 both in the same layer as the connector 56. In this embodiment, the output signal line 54 is not disposed between the first voltage line 51 and the connector 56, which is in the same layer as the first voltage line 51, of the connector 42. Thus, the parasitic capacitance of the node Nd includes the capacitance due to electrical coupling between the connector 56 of the connector 42 and the first voltage line 51. FIG. 4 illustrates this capacitance as a virtual capacitive element 17.

If the combination of the photoelectric converter 12 and the signal detection transistor 13 is assumed to be a single field-effect transistor, the gate capacitance Cc is represented by $Cc=((Cp+C3) \times Cn/(C3+Cp+Cn))$, wherein C3 denotes the parasitic capacitance of the node Nd in the photosensor 10C (see FIG. 4). Studies by the present inventor show that the capacitance C3 can be greater than the capacitance Cp of the photoelectric converter 12 and the capacitance Cn of the gate-insulating layer 13g of the signal detection transistor 13. In particular, the effects of parasitic capacitance on the capacitance Cc tend to be enhanced with a decrease in the size of a light-receiving region of the photosensor 10C, and the capacitance C3 is sometimes greater than the capacitance Cp or Cn by an order of magnitude. When the node Nd has a parasitic capacitance greater than the capacitance of the photoelectric converter 12 and the capacitance of the gate-insulating layer 13g, a change in the capacitance Cp of the photoelectric converter 12 due to a change in illuminance is negligibly reflected in the capacitance Cc. This results in low sensitivity.

Figure 5:
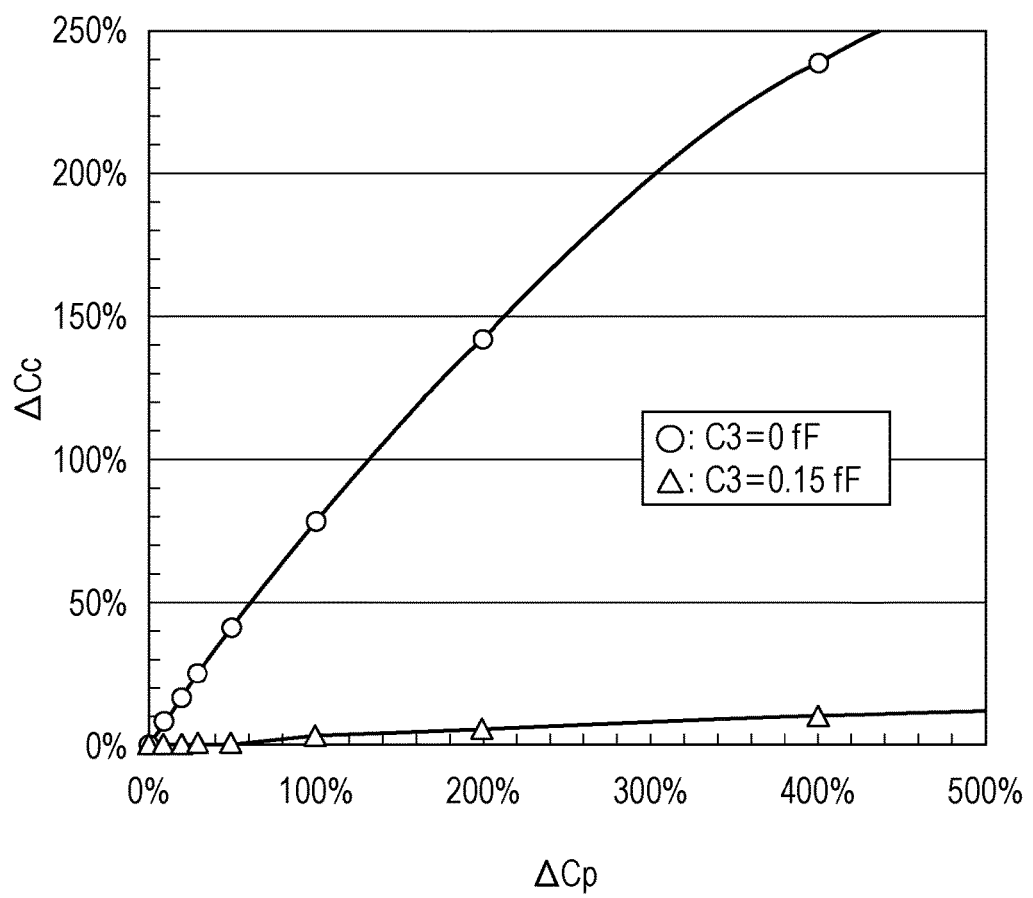
FIG. 5 is a graph of exemplary calculation results of a change in gate capacitance Cc as a function of the capacitance Cp of a photoelectric converter when a combination of the photoelectric converter and a signal detection transistor in a photosensor according to a comparative example is assumed to be a single field-effect transistor.

FIG. 5 shows the calculation results of a change in capacitance Cc as a function of the capacitance Cp of the photoelectric converter 12 in the comparative example. In the graph of FIG. 5, the horizontal axis represents the rate of change $\Delta Cp$ in the capacitance Cp due to a change in illuminance on the photosensor 10C. For example, when a change in illuminance doubles the capacitance with respect to the capacitance at a certain illuminance, the rate of change is 100%. In the graph of FIG. 5, the vertical axis represents the rate of change $\Delta Cc$ in capacitance Cc as a function of the change in capacitance Cp. For example, when a change in capacitance Cp doubles the capacitance Cc, the rate of change $\Delta Cc$ is 100%.

In FIG. 5, a line with open circles (O) corresponds to C3=0, and a line with white triangles (Δ) corresponds to C3=0.15 fF. As illustrated in FIG. 5, for C3=0.15 fF, the capacitance Cc changes little with the capacitance Cp of the photoelectric converter 12. Thus, in the photosensor 10C according to the comparative example, sensitivity is significantly reduced by electrical coupling between the first voltage line 51 having a fixed electric potential and the connector 56, which is in the same layer as the first voltage line 51, of the connector 42.

Figure 6:
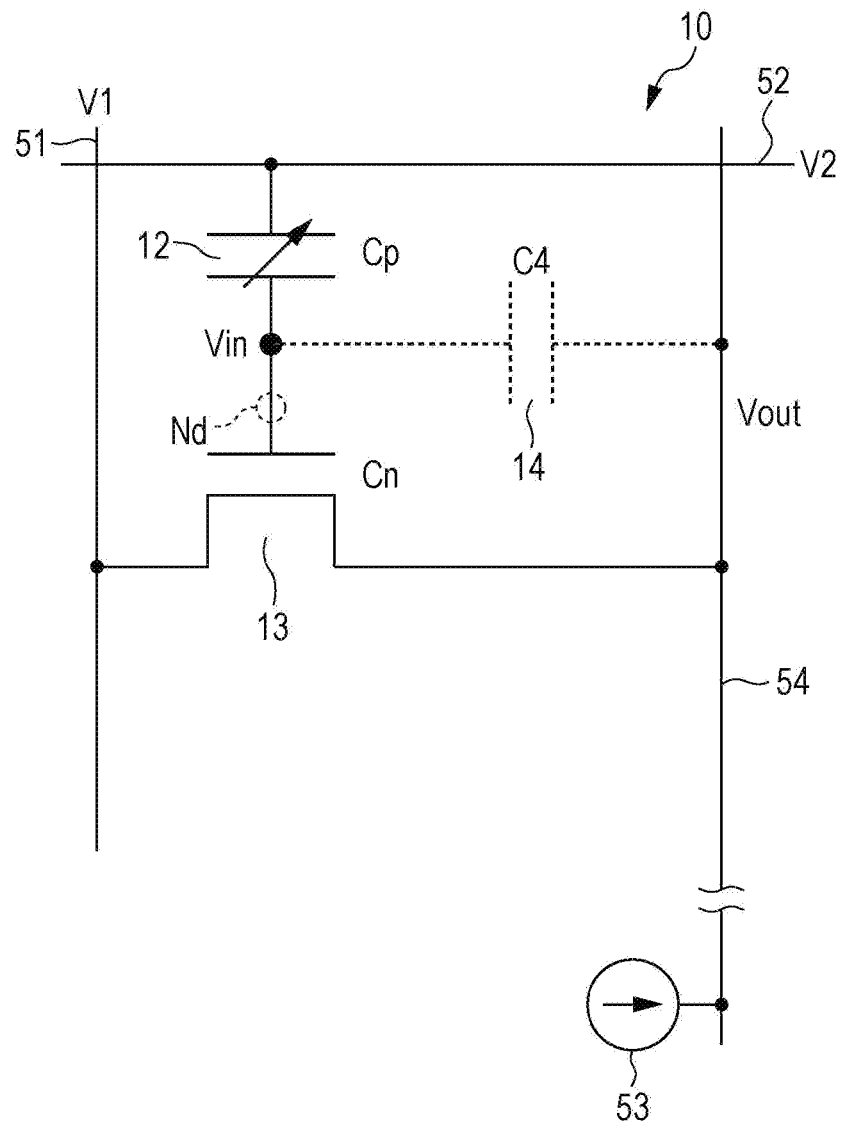
FIG. 6 is an equivalent circuit diagram of the photosensor illustrated in FIG. 2.

FIG. 6 illustrates an equivalent circuit of the photosensor 10 illustrated in FIG. 2. As illustrated in FIG. 2, in the photosensor 10, the output signal line 54 is closer to the connector 42 than the first voltage line 51. Thus, the output signal line 54 can be more strongly electrically connected to the connector 42 than the first voltage line 51, to which a certain voltage is applied when the photosensor 10 operates. FIG. 6 illustrates electrical coupling between the node Nd of the photosensor 10 and the output signal line 54 as a virtual capacitive element 14 coupled between the node Nd and the output signal line 54. The capacitance C4 of the capacitive element 14, which is the parasitic capacitance of the node Nd of the photosensor 10, can be similar to the capacitance C3.

As schematically illustrated in FIG. 4, in the photosensor 10C according to the comparative example, the first voltage line 51 has a fixed electric potential. Thus, the parasitic capacitance (the capacitive element 17) formed by electrical coupling between the connector 56 of the connector 42 and the first voltage line 51 has a constant potential at one end. In such a structure, assume that light irradiation changes the electric potential of the node Nd. The potential difference between the plates of the capacitive element 17 changes to the same degree as the change in the electric potential of the node Nd due to light irradiation. Thus, in the photosensor 10C according to the comparative example, the relatively large parasitic capacitance directly affects the change in the electric potential of the node Nd due to a change in illuminance. In other words, because of the relatively large parasitic capacitance, a change in the capacitance Cp of the photoelectric converter 12 due to a change in illuminance may result in an insufficient change in capacitance Cc as the whole gate capacitance.

In contrast, in the embodiment described above, the output signal line 54 between the first voltage line 51 and the connector 56, which is in the same layer as the first voltage line 51, of the connector 42 actively forms electrical coupling with the connector 56 of the connector 42. Thus, the electric potential of the capacitive element 14 schematically illustrated in FIG. 6 on the side of the output signal line 54 changes with the change in the electric potential of the node Nd.

The input voltage of the gate electrode 13e of the signal detection transistor 13 (which may also be referred to as the voltage of the node Nd) is denoted by Vin, the voltage of the output signal line 54 is denoted by Vout, and the voltage gain of the source follower is denoted by A (A=(Vout/Vin)). The voltage gain A of the source follower in the photosensor 10 is approximately 0.85, for example. The potential difference between the plates of the capacitive element 14 is represented by (Vin−Vout)=(1−A)×Vin. For A=0.85, the potential difference is only approximately one seventh of Vin. Even if the capacitance C4 is the same as the capacitance C3, the effects of the parasitic capacitance on the gate capacitance are substantially reduced (one seventh) compared with the case of no electrical coupling between the connector 42 and the output signal line 54. In other words, the electrical coupling is as effective as a decrease in effective parasitic capacitance to approximately one seventh, thus resulting in a significant change in capacitance C as the whole gate capacitance.

Figure 7:
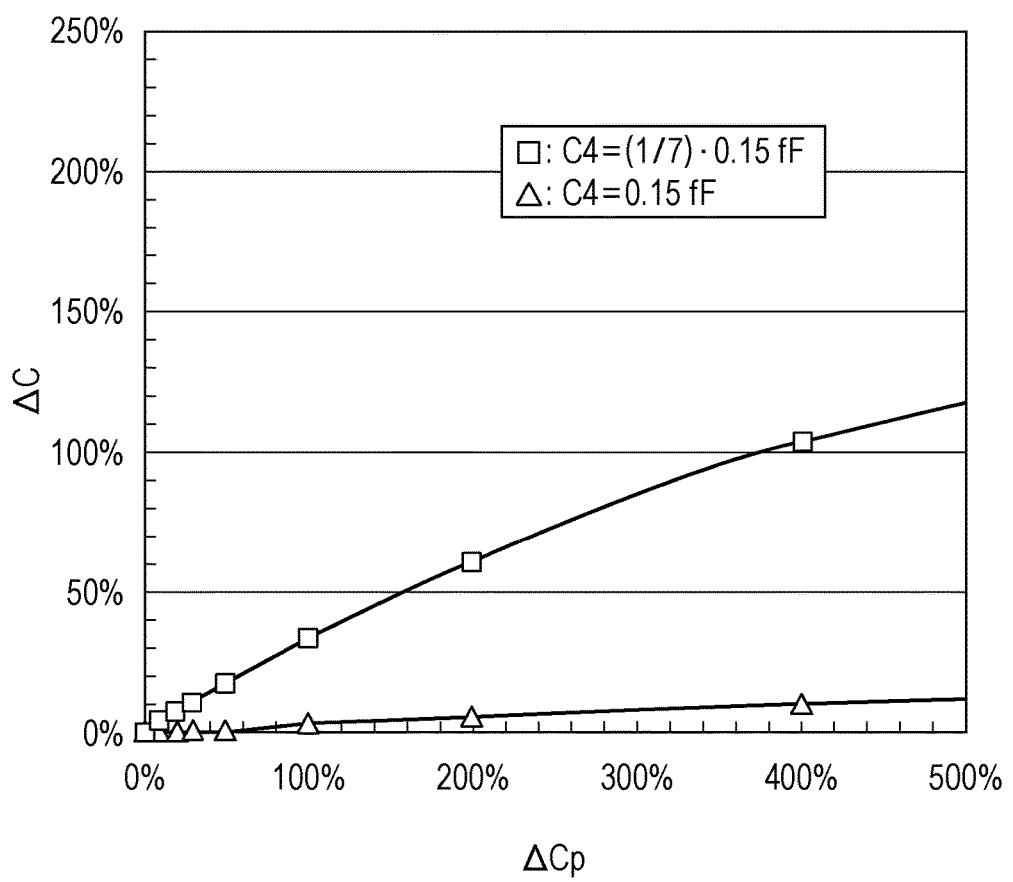
FIG. 7 is a graph of exemplary calculation results of a change in gate capacitance C as a function of the capacitance Cp of a photoelectric converter when a combination of the photoelectric converter and a signal detection transistor in a photosensor is assumed to be a single field-effect transistor.

FIG. 7 shows the calculation results of a change in capacitance C in the photosensor 10 as a function of the capacitance Cp of the photoelectric converter 12. In the graph of FIG. 7, the horizontal axis represents the rate of change ΔCp in the capacitance Cp due to a change in illuminance on the photosensor 10. In the graph of FIG. 7, the vertical axis represents the rate of change ΔC in capacitance C as a function of the change in capacitance Cp.

In FIG. 7, a line with white triangles (Δ) corresponds to the rate of change ΔC for C4=0.15 fF and is the same as ΔCc in FIG. 5. A line with white squares (□) corresponds to the rate of change ΔC in the case where the output signal line 54 is disposed between the connector 42 and the first voltage line 51. As illustrated in FIG. 7, the output signal line 54 between the connector 42 and the first voltage line 51 increases the rate of change ΔC compared with the case where the output signal line 54 is not disposed between the connector 42 and the first voltage line 51. Thus, electrical coupling between the connector 42 and the output signal line 54 can improve sensitivity.

Coupling stronger than electrical coupling between the connector 42 and a voltage line having a fixed electric potential during operation (for example, the first voltage line 51 or the second voltage line 52) is formed between the output signal line 54 and the connector 42 in this way. This can suppress the decrease in sensitivity resulting from the parasitic capacitance of the node Nd. The output signal line 54 closer to the connector 42 than a voltage line having a fixed electric potential during operation can suppress the decrease in sensitivity. Thus, the output signal line 54 is not necessarily in the same layer as a voltage line having a fixed electric potential during operation. At least the distance between the output signal line 54 and the connector 42 is smaller than the distance between the connector 42 and a voltage line having a fixed electric potential during operation. The output signal line 54 on a line segment between the connector 42 and a voltage line having a fixed electric potential during operation can more advantageously shield the electric field between the connector 42 and the voltage line having a fixed electric potential during operation.

Figure 8:
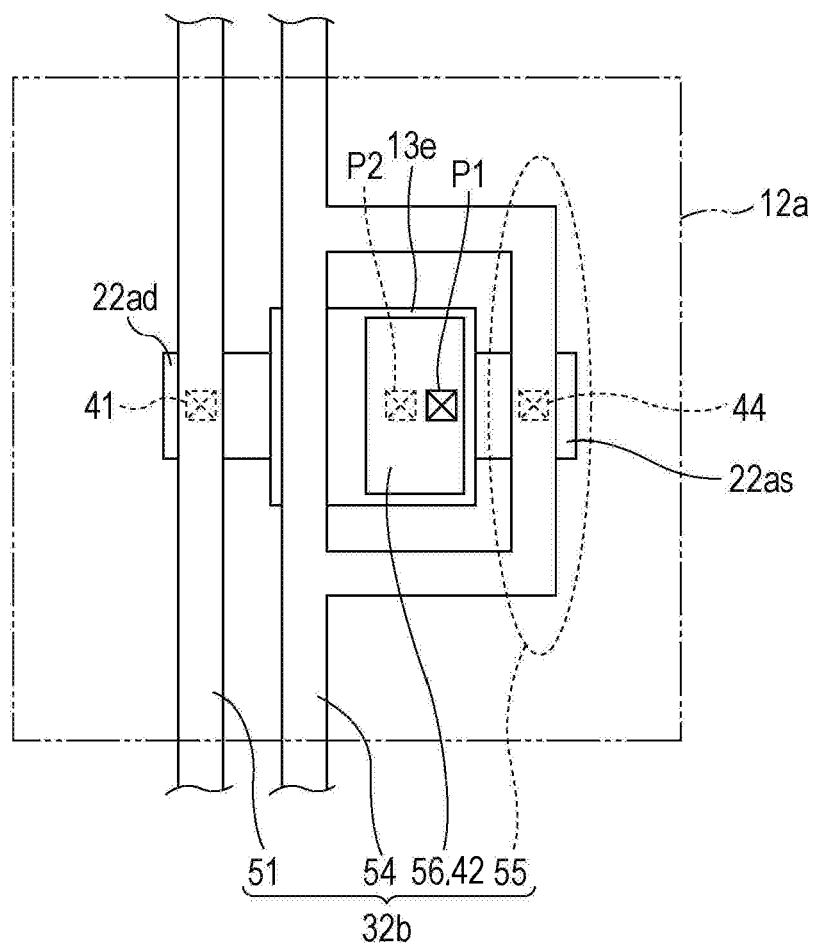
FIG. 8 is a plan view of a wiring layout of a photosensor.

FIG. 8 illustrates a wiring layout of the photosensor 10. FIG. 8 illustrates an arrangement of the first voltage line 51, the output signal line 54, and the connector 56 of the connector 42 in the wiring layer 32b, viewed in the direction normal to the semiconductor substrate 22.

In the structure illustrated in FIG. 8, the output signal line 54 between the first voltage line 51 and the connector 56 of the connector 42 is parallel to the first voltage line 51. As a matter of course, the wiring layout illustrated in FIG. 8 is only an example, and the output signal line 54 is not necessarily parallel to the first voltage line 51 and not necessarily has the same length as the first voltage line 51. At least part of the output signal line 54 can be disposed between the first voltage line 51 and the connector 42 so that the output signal line 54 shields electrical coupling between the first voltage line 51 and the connector 42.

In the embodiment illustrated in FIG. 8, the connector 56 of the connector 42 is a rectangle extending in the direction perpendicular to the drawing. In order that the output signal line 54 can shield electrical coupling between the first voltage line 51 and the connector 42, it is more effective to place at least part of the output signal line 54 along a long side of the rectangular connector 56 than along a short side of the connector 56. Furthermore, in this embodiment, the wire 55 and the output signal line 54 surround the connector 56 of the connector 42. Surrounding the connector 42 with the output signal line 54 and a wire having the same electric potential as the output signal line 54 can more effectively reduce electrical coupling between the connector 42 and a wire (or electrode) having a fixed electric potential during operation. The connector 42 may be surrounded by a plug that couples the output signal line 54 to another wiring layer.

Figure 9:
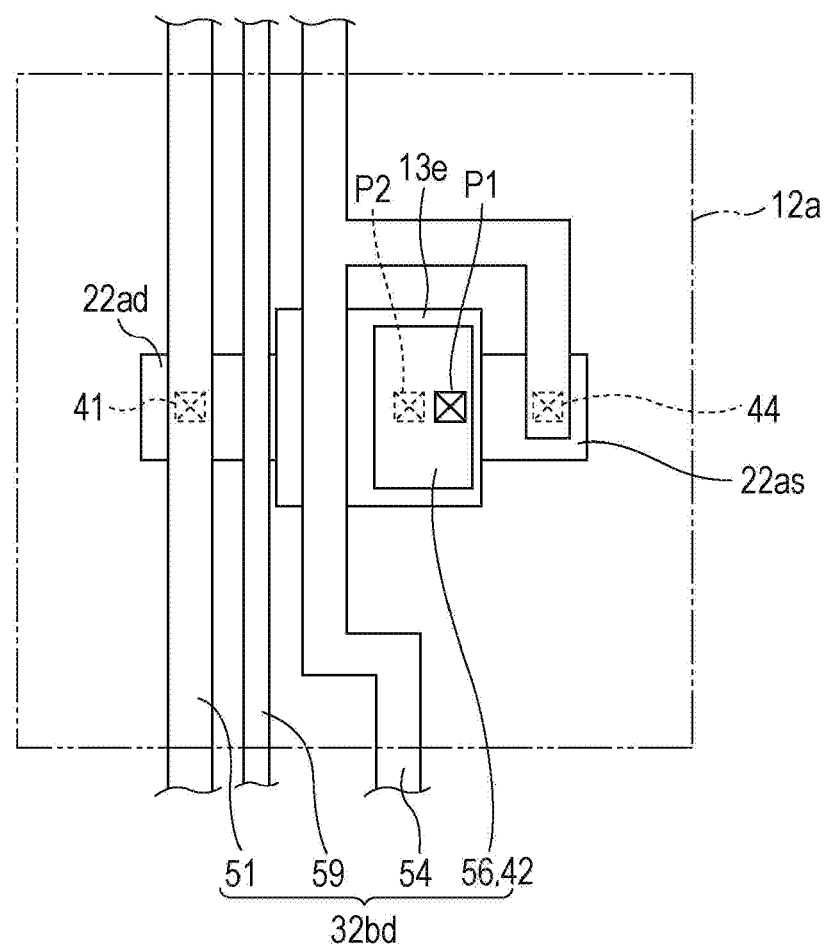
FIG. 9 is a plan view of another wiring layout around a connector.

FIG. 9 illustrates another wiring layout around the connector 42. A wire to be separated from the connector 42 by at least part of the output signal line 54 is not limited to the first voltage line 51 or the second voltage line 52. Such a wire may be a wire having the same electric potential as the first voltage line 51 or the second voltage line 52 or may be another wire having a fixed electric potential during operation. In the embodiment illustrated in FIG. 9, a wiring layer 32bd including the connector 56 of the connector 42, the output signal line 54, and the first voltage line 51 includes a wire 59 having a constant potential during the operation of the photosensor 10. In this embodiment, the output signal line 54 is disposed between the wire 59 and the connector 56 of the connector 42. The output signal line 54 is also disposed between the first voltage line 51 and the connector 56. Thus, the output signal line 54 can reduce the effects of electrical coupling between the wire 59 and the connector 56 and electrical coupling between the first voltage line 51 and the connector 56. At least part of the output signal line 54 between the connector 42 and a wire having a fixed electric potential during operation can suppress the decrease in sensitivity resulting from parasitic capacitance.

In the case where the first voltage line 51 and the wire 59 are disposed in different wiring layers, at least part of the output signal line 54 or a wire having the same electric potential as the output signal line 54 is disposed between a portion of the connector 42 in the same layer as the first voltage line 51 and the first voltage line 51, or between a portion of the connector 42 in the same layer as the wire 59 and the wire 59, or both. As illustrated in FIG. 9, the output signal line 54 is not limited to a linear wire and may have a bend, a branch, or the like.

Figure 10:
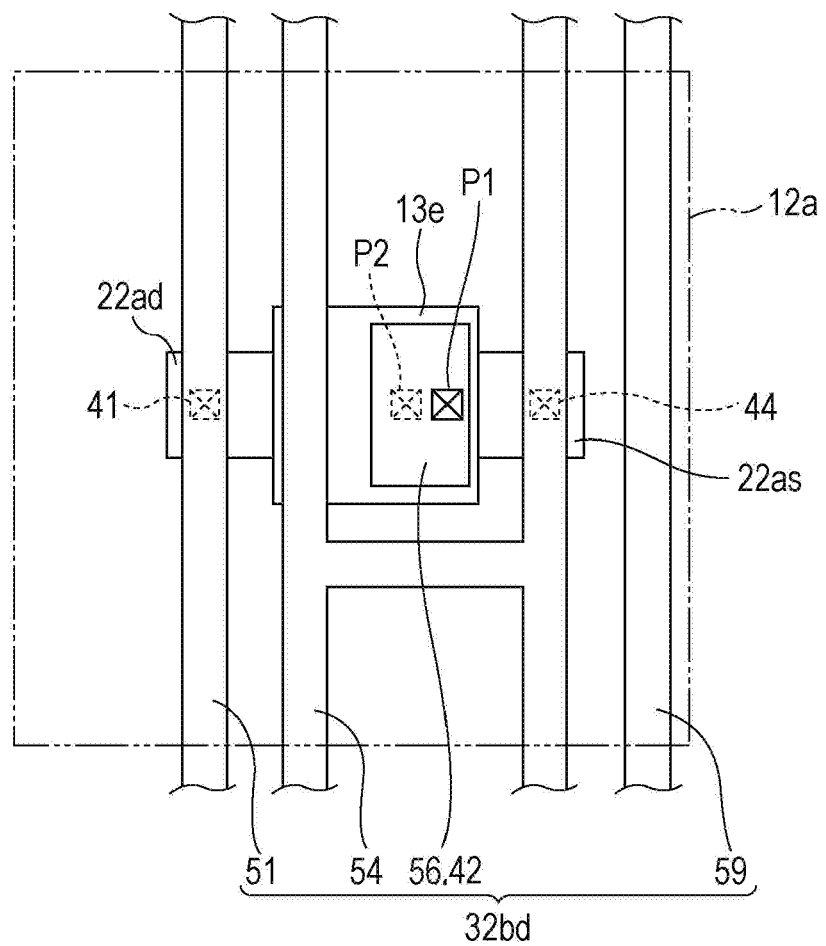
FIG. 10 is a plan view of still another wiring layout around a connector.

FIG. 10 illustrates still another wiring layout around the connector 42. In the embodiment illustrated in FIG. 9, the first voltage line 51 and the wire 59 are disposed on the left side of the connector 42 and are on the opposite side of the output signal line 54 to the connector 42. As illustrated in FIG. 10, in the case where the connector 42 is disposed between the first voltage line 51 and the wire 59, at least part of the output signal line 54 may be disposed between the first voltage line 51 and the connector 42 and between the wire 59 and the connector 42.

Second Embodiment

Figure 11:
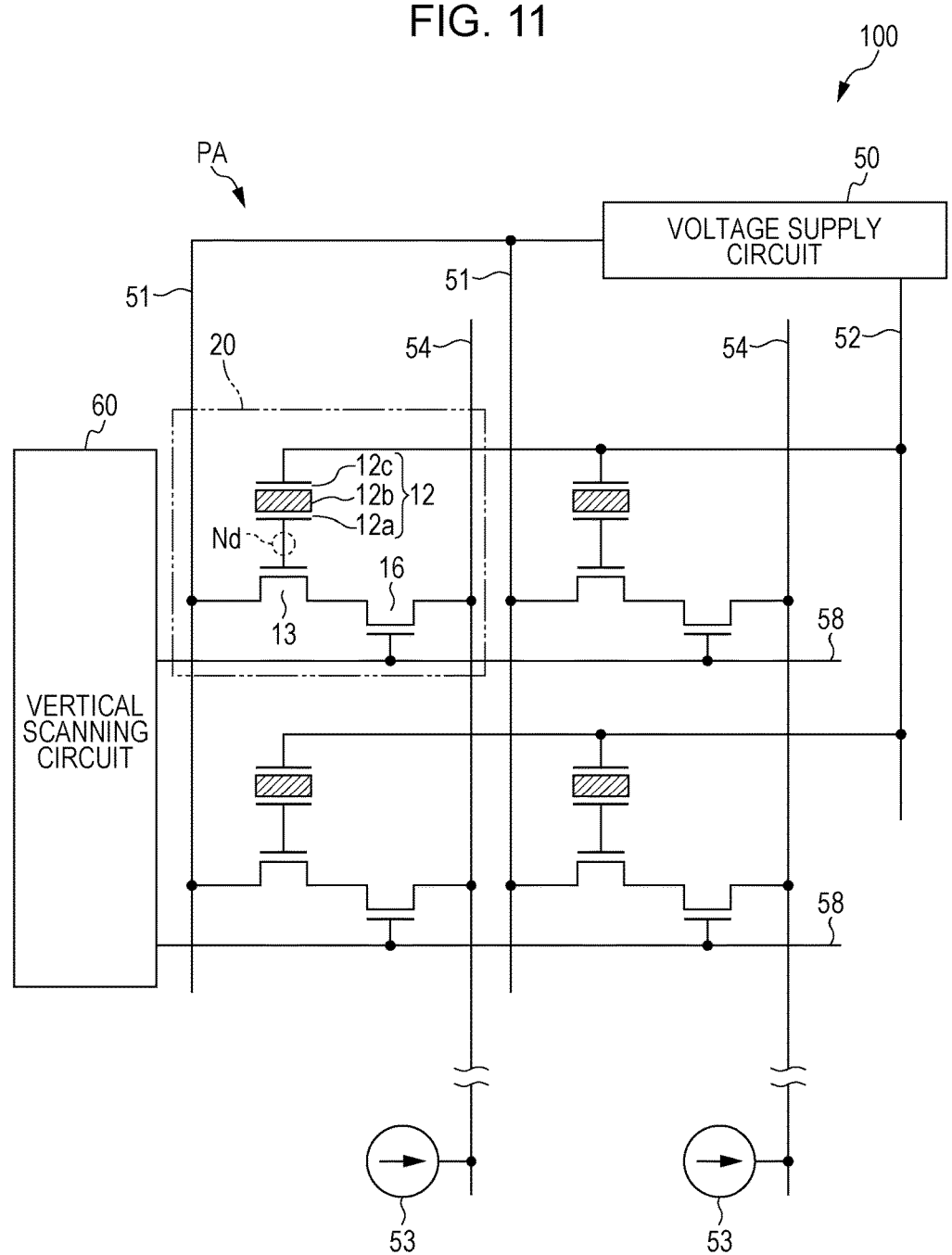
FIG. 11 is a schematic view of exemplary circuitry of an imaging device according to a second embodiment of the present disclosure.

FIG. 11 schematically illustrates exemplary circuitry of an imaging device 100 according to a second embodiment of the present disclosure. The imaging device 100 illustrated in FIG. 11 includes a pixel array PA of pixel cells 20. As schematically illustrated in FIG. 11, each of the pixel cells 20 includes a photoelectric converter 12 and a signal detection transistor 13, the gate of which is electrically connected to the photoelectric converter 12. Thus, each of the pixel cells 20 includes the structure of the photosensor 10.

A one- or two-dimensional array of the pixel cells 20 forms an image pickup region (photosensitive region). The signal detection transistor 13 of each of the pixel cells 20 can be formed on a common semiconductor substrate 22. Each of the pixel cells 20 is electrically separated from the other pixel cells 20 by an element isolation region 22t (see FIG. 2) formed on the semiconductor substrate 22.

FIG. 11 illustrates a matrix of the pixel cells 20. In order to avoid excessively complicated drawing, however, a 2×2 matrix of four pixel cells 20 is illustrated. The distance (pixel pitch) between adjacent two pixel cells in the row direction or in the column direction is approximately 2 µm, for example. The terms "row direction" and "column direction", as used herein, refer to the extending direction of a row and the extending direction of a column, respectively. For example, the horizontal direction on the drawing of FIG. 11 is the row direction, and the vertical direction on the drawing is the column direction. It goes without saying that the number and arrangement of the pixel cells 20 in the imaging device 100 are not limited to those illustrated in FIG. 11. For example, the pixel cells 20 may be a one-dimensional array. In this case, the imaging device 100 can be used as a line sensor. The pixel cells 20 are not necessarily accurately aligned in the row direction and in the column direction.

As schematically illustrated in FIG. 11, an address transistor 16 is coupled between one of the source and drain (source in the present embodiment) of the signal detection transistor 13 and the output signal line 54. As described later, the address transistor 16 is typically formed on the semiconductor substrate 22 in the same manner as the signal detection transistor 13. As illustrated in the figure, the output signal line 54 is disposed in each column of the pixel cells 20.

The gate of the address transistor 16 is coupled to an address signal line 58. The address signal line 58 is disposed in each row of the pixel cells 20 and is coupled to a vertical scanning circuit (which may also be referred to as a "row scanning circuit") 60. The vertical scanning circuit 60 controls the electric potential of the address signal line 58, selects a row of the pixel cells 20, reads the output of the selected row of the pixel cells 20, and sends the output to the output signal line 54.

In this embodiment, like the output signal line 54, the first voltage line 51 is disposed in each column of the pixel cells 20. The other of the source and drain (drain in the present embodiment) of the signal detection transistor 13 is coupled to corresponding one of the first voltage lines 51 disposed in the columns of the pixel cells 20. The address transistor 16 may be coupled between the first voltage line 51 and the signal detection transistor 13.

The first voltage line 51 is coupled to a voltage supply circuit 50. In this embodiment, the second voltage line 52 is also coupled to the voltage supply circuit 50. The second voltage line 52 is electrically connected to the transparent electrode 12c of the photoelectric converter 12 in each of the pixel cells 20.

When the imaging device 100 operates, the voltage supply circuit 50 supplies a first bias voltage to (in the present embodiment, the drain of) the signal detection transistor 13 via the first voltage line 51. When the imaging device 100 operates, the voltage supply circuit 50 supplies a second bias voltage to the photoelectric converter 12 of each of the pixel cells 20 via the second voltage line 52. In other words, when the imaging device 100 operates, the voltage supply circuit 50 applies a voltage in a predetermined range based on the electric potential of the drain of the signal detection transistor 13 to the transparent electrode 12c of each of the pixel cells 20. The voltage supply circuit 50 is not limited to a particular power supply circuit and may be a circuit that generates a predetermined voltage or a circuit that converts a voltage supplied from another power supply into a predetermined voltage. The voltage supply circuit 50 may include a first voltage supply circuit coupled to the first voltage line 51 and a second voltage supply circuit coupled to the second voltage line 52. At least one of a circuit that supplies a first bias voltage to the first voltage line 51 and a circuit that supplies a second bias voltage to the second voltage line 52 may be part of the vertical scanning circuit 60. The imaging device 100 may include a controller that controls, for example, the voltage supply circuit 50 and the vertical scanning circuit 60.

Figure 12:
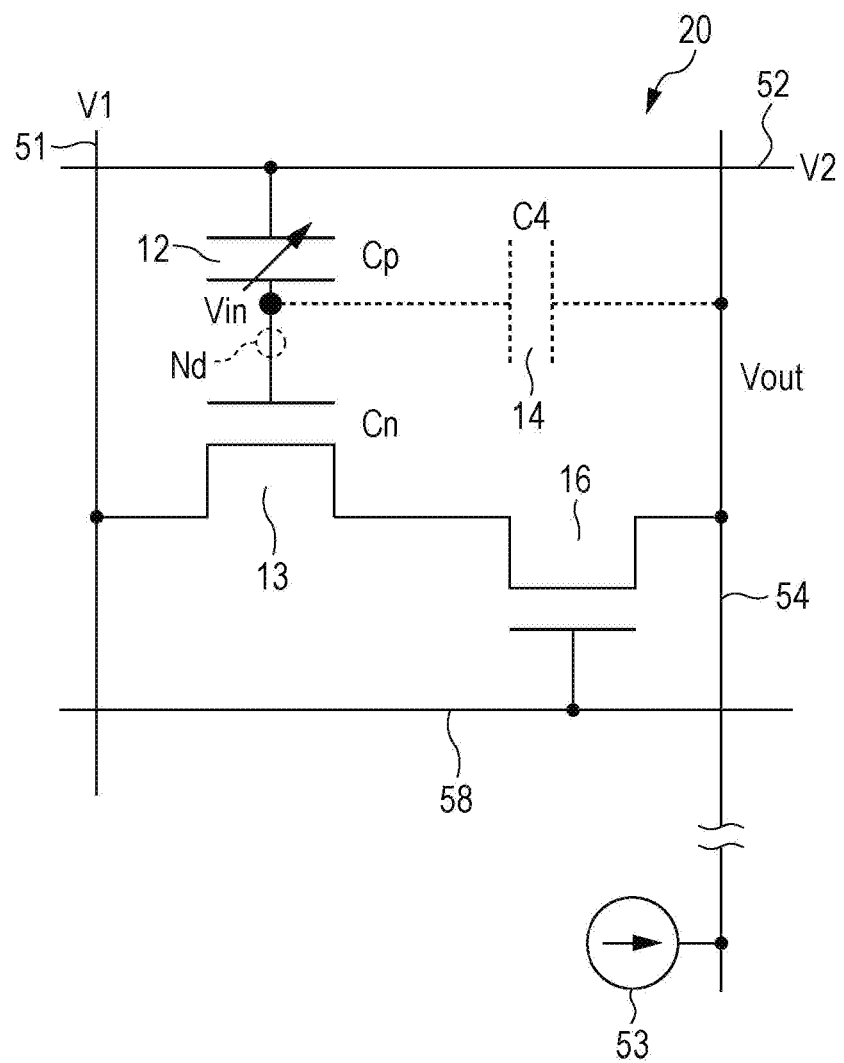
FIG. 12 is an equivalent circuit diagram of a pixel cell.

FIG. 12 illustrates an equivalent circuit of the pixel cells 20. In the same manner as in the photosensor 10 according to the first embodiment, the signal detection transistor 13 of each of the pixel cells 20 in the pixel array PA outputs an electric signal corresponding to a change in dielectric constant between the pixel electrode 12a and the transparent electrode 12c caused by the incidence of light on the photoelectric conversion layer 12b through the transparent electrode 12c. As schematically illustrated in FIG. 12, electrical coupling between the node Nd and the output signal line 54 in each of the pixel cells 20 can be actively formed to ensure sufficient sensitivity in each of the pixel cells 20 according to the principle described with reference to FIGS. 4 to 7.

Device Structure of Pixel Cell 20

Figure 13:
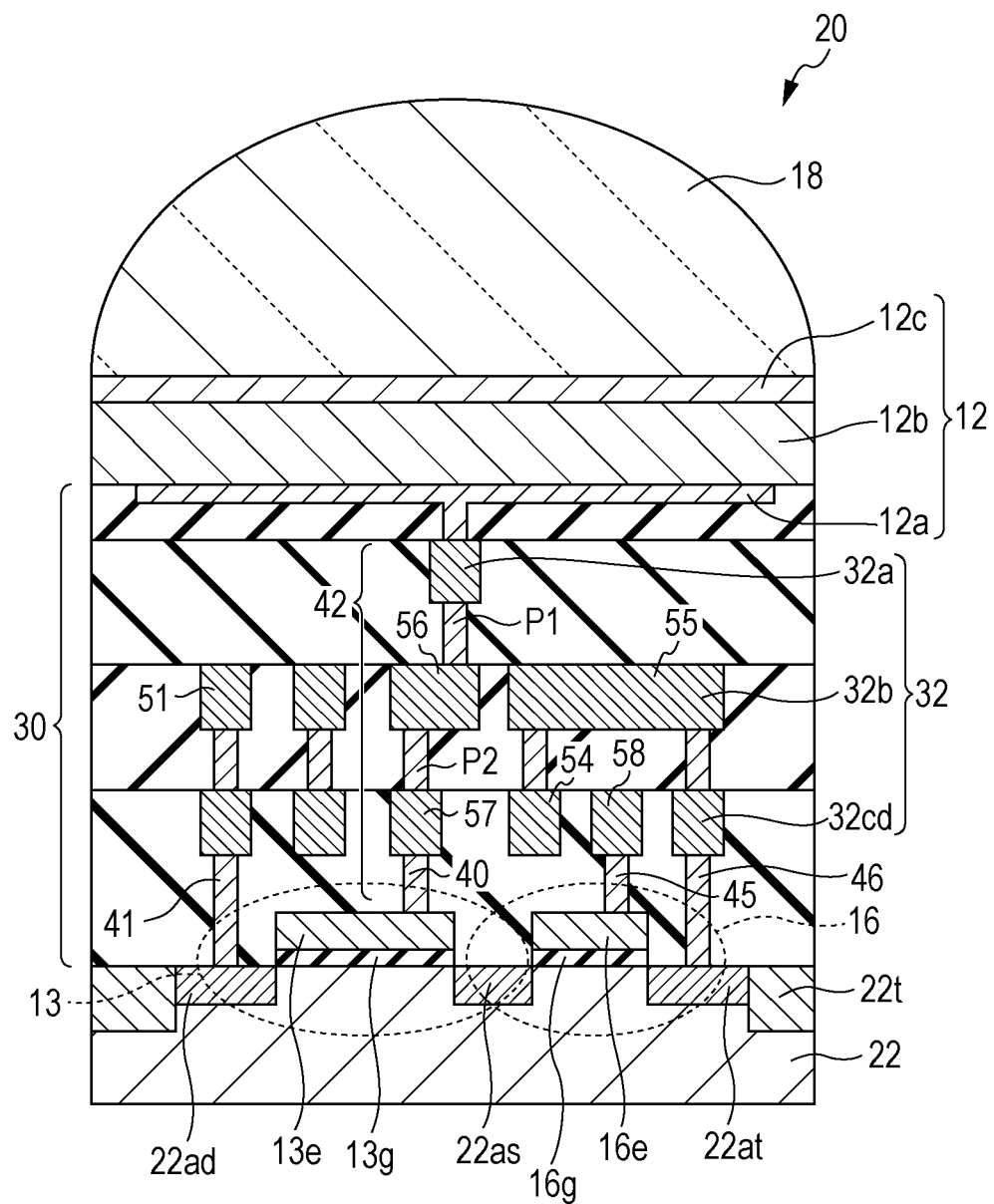
FIG. 13 is a schematic cross-sectional view of a typical device structure of a pixel cell.

FIG. 13 schematically illustrates a typical device structure of the pixel cell 20. In the same manner as in the photosensor 10, the photoelectric converter 12 is typically disposed on the interlayer insulating layer 30 over the semiconductor substrate 22. The pixel electrode 12a in the photoelectric converter 12 is spatially separated from the pixel electrodes 12a of adjacent pixel cells 20 and is thereby electrically separated from the pixel electrodes 12a of the other pixel cells 20. The photoelectric conversion layer 12b is typically formed across the pixel cells 20. Formation of the photoelectric conversion layer 12b as a continuous single layer across the pixel cells 20 can avoid a complicated manufacturing process. Likewise, the transparent electrode 12c can also be formed across the pixel cells 20. Formation of the transparent electrode 12c as a continuous single electrode across the pixel cells 20 can avoid a complicated manufacturing process. When the imaging device 100 operates, if a predetermined potential difference can be applied between the transparent electrode 12c and the impurity region 22ad, the transparent electrode 12c may be separately formed in each of the pixel cells 20.

In the structure illustrated in FIG. 13, the address transistor 16 includes impurity regions 22as and 22at (n-type regions in the present embodiment) disposed in the semiconductor substrate 22, a gate-insulating layer 16g disposed on the semiconductor substrate 22, and a gate electrode 16e disposed on the gate-insulating layer 16g. Typically, the gate-insulating layer 16g and the gate electrode 16e of the address transistor 16 are in the same layer as the gate-insulating layer 13g and the gate electrode 13e of the signal detection transistor 13, respectively.

The impurity regions 22as and 22at function as a drain region and a source region of the address transistor 16, respectively. In this embodiment, the address transistor 16 and the signal detection transistor 13 share the impurity region 22as and are thereby electrically connected to each other. In this embodiment, the output signal line 54 is electrically connected to the impurity region 22at via a contact plug 46 and a wire 55, and an address signal line 58 is electrically connected to the gate electrode 16e of the address transistor 16 via a contact plug 45. The electric potential of the gate electrode 16e can be controlled via the address signal line 58 to turn on the address transistor 16, thereby selectively reading the output of the signal detection transistor 13 and sending the output to the output signal line 54 via the address transistor 16. The signal detection transistor 13 and the address transistor 16 constitute a signal detection circuit for detecting signals from the photoelectric converter 12.

In the structure illustrated in FIG. 13, the address signal line 58 and the output signal line 54 are part of a wiring layer 32cd in the multilayer wiring 32 and are therefore disposed in the same layer. In this embodiment, the wiring layer 32cd includes a connector 57 that couples a plug P2 to a contact plug 40 in a connector 42. In this embodiment, the address signal line 58, the output signal line 54, and the connector 57 of the connector 42 are disposed in the same layer. As schematically illustrated in FIG. 13, the output signal line 54 is disposed between the address signal line 58 and the connector 57.

When the imaging device 100 operates, a high-level signal or a low-level signal is selectively applied to the address signal line 58. More specifically, when the address transistor 16 of the pixel cell 20 to be selected is in the on state, the electric potential of the address signal line 58 is fixed at a high level, and when the address transistor 16 is in the off state, the electric potential of the address signal line 58 is fixed at a low level. Thus, whether high level or low level, basically, the electric potential of the address signal line 58 is fixed for a predetermined period of operation. Thus, strong electrical coupling between the address signal line 58 and the connector 42 may result in reduced sensitivity of the pixel cell 20, for the same reason as strong electrical coupling between the first voltage line 51 and the connector 42, for example. In the structure illustrated in FIG. 13, since the output signal line 54 is closer to the connector 57 than the address signal line 58, this enhances electrical coupling between the output signal line 54 and the connector 42. This reduces the effects of electrical coupling between the address signal line 58 and the connector 42 and produces the same effects as a decreased effective parasitic capacitance of the connector 42. This suppresses the decrease in sensitivity, in the same manner as in the first embodiment.

As a matter of course, in the same manner as in the first embodiment, at least part of the output signal line 54 (or a wire having the same electric potential as the output signal line 54) may be disposed between the first voltage line 51 and the connector 42. Furthermore, at least part of the output signal line 54 not only between the address signal line 58 and the connector 42 but also between the connector 42 and a wire having a fixed electric potential for a predetermined period when the imaging device 100 operates (for example, the first voltage line 51) can more effectively suppress the decrease in sensitivity.

Figure 14:
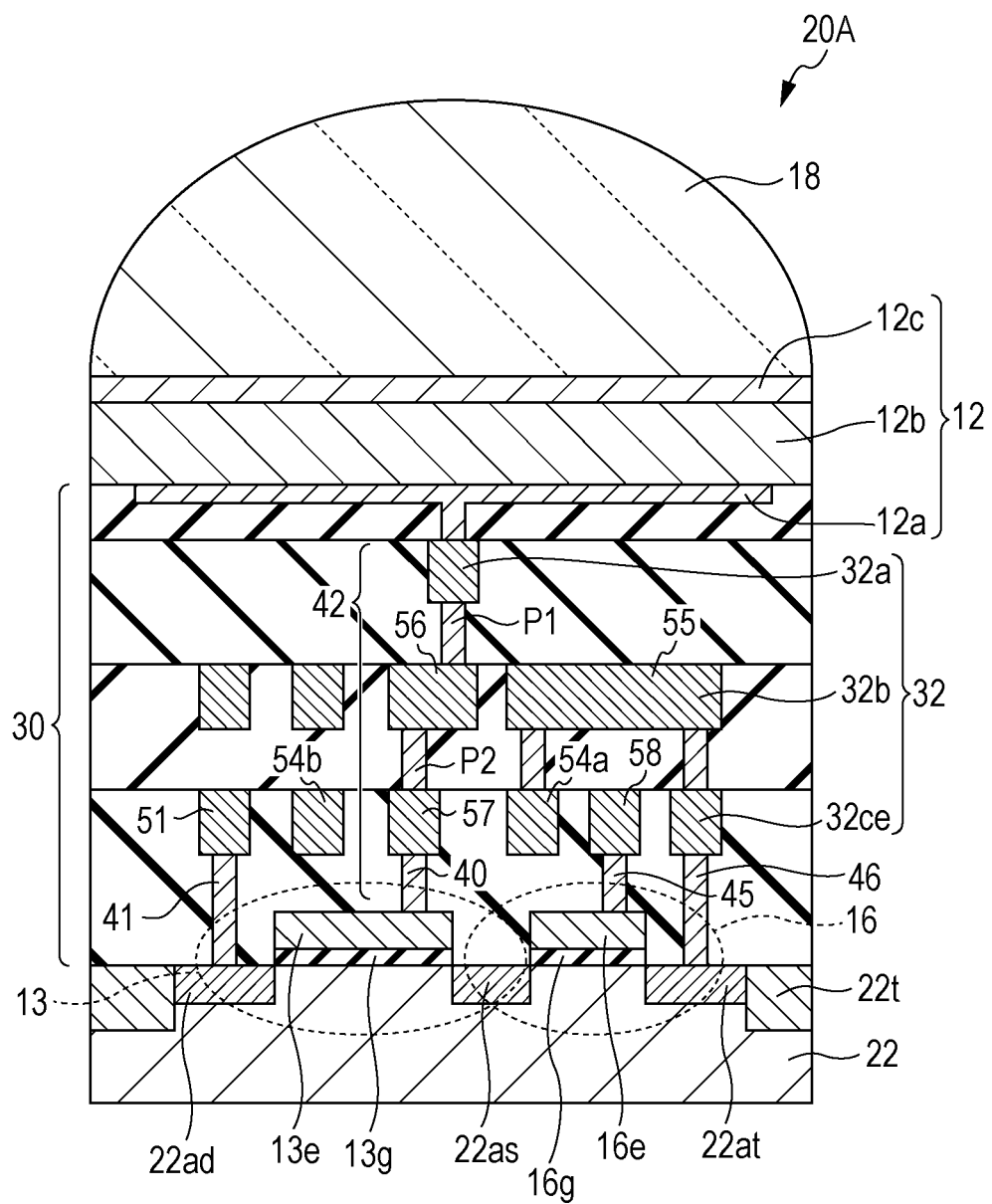
FIG. 14 is a schematic cross-sectional view of a device structure of a pixel cell according to a first modified example of the second embodiment.

FIG. 14 illustrates a first modified example of the second embodiment. A pixel cell 20A illustrated in FIG. 14 includes multilayer wiring 32 including a wiring layer 32ce. In this embodiment, the wiring layer 32ce includes the first voltage line 51, wires 54a and 54b, the connector 57 of the connector 42, and the address signal line 58. As schematically illustrated in FIG. 14, the wire 54a is electrically connected to the impurity region 22at via the wire 55 and the contact plug 46. Thus, the wire 54a constitutes part of the output signal line 54. In the present embodiment, the wire 54b is electrically connected to the wire 54a and, like the wire 54a, constitutes part of the output signal line 54.

As illustrated in FIG. 14, the wire 54a and the wire 54b may be disposed between the address signal line 58 and the connector 42 (the connector 57 in the wiring layer 32ce in the present embodiment) and between the first voltage line 51 and the connector 42, respectively. This can suppress the decrease in sensitivity resulting from electrical coupling between the first voltage line 51 and the connector 42 and electrical coupling between the address signal line 58 and the connector 42. If both the first voltage line 51 and the address signal line 58 are disposed on the right or left side of the connector 57 in a cross section perpendicular to a main surface of the semiconductor substrate 22, at least part of the output signal line 54 is disposed between the first voltage line 51 and the connector 57 and between the address signal line 58 and the connector 57. If at least the distance between the connector 42 and the output signal line 54 is smaller than the distance between the connector 42 and the first voltage line 51 and the distance between the connector 42 and the address signal line 58, the decrease in sensitivity can be suppressed.

Figure 15:
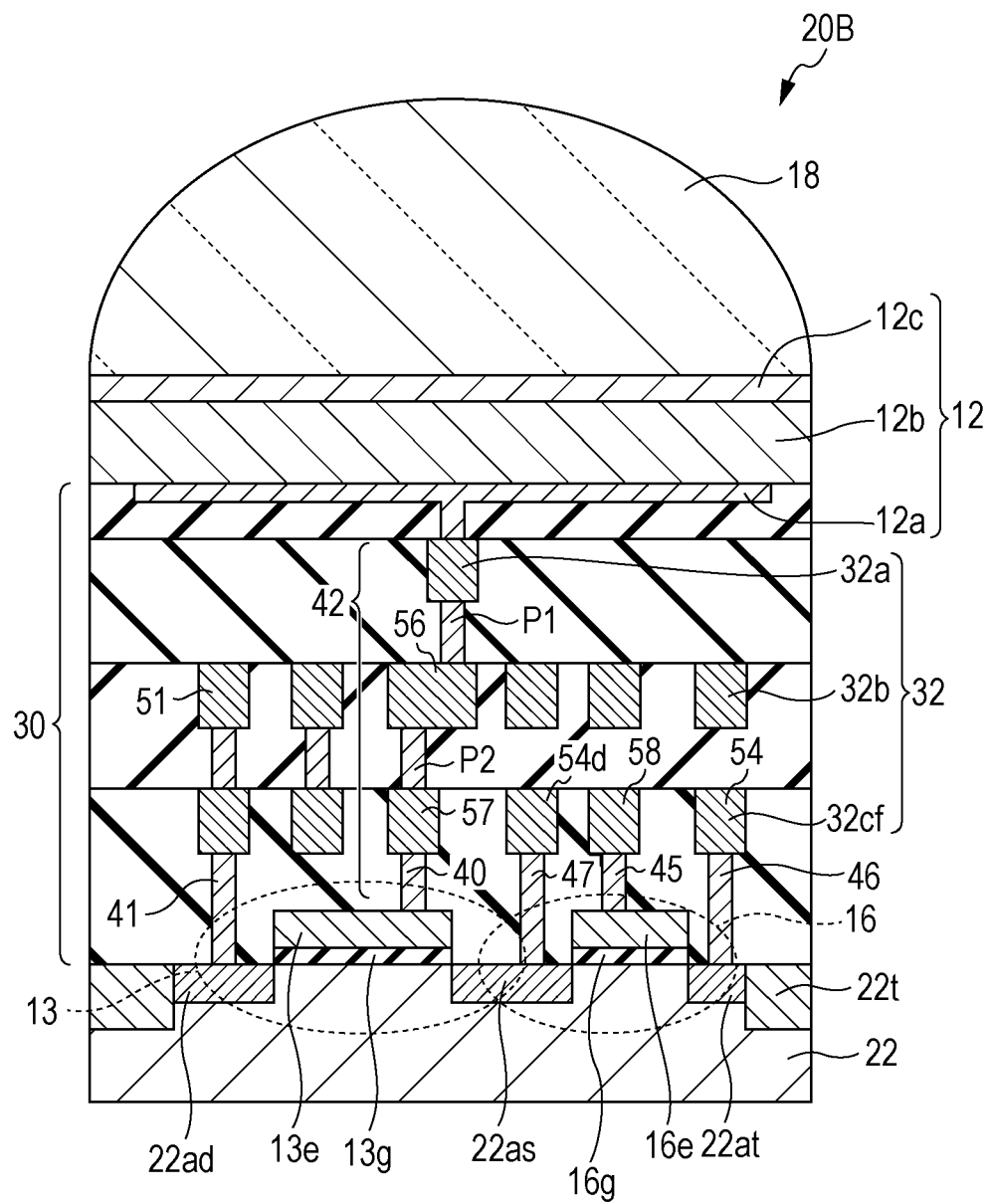
FIG. 15 is a schematic cross-sectional view of a device structure of a pixel cell according to a second modified example of the second embodiment.

FIG. 15 illustrates a second modified example of the second embodiment. Multilayer wiring 32 in a pixel cell 20B illustrated in FIG. 15 includes a wiring layer 32*cf* including a wire 54*d*. The wire 54*d* is electrically connected via a contact plug 47 to the impurity region 22*as* serving as the source region of the signal detection transistor 13.

In the structure illustrated in FIG. 15, in addition to the wire 54*d*, the wiring layer 32*cf* includes the connector 57 of the connector 42, the address signal line 58, and the output signal line 54. In this embodiment, the wire 54*d* electrically connected to the impurity region 22*as* is disposed between the connector 57 and the address signal line 58. Thus, coupling between the wire 54*d* and the connector 42 is stronger than coupling between the address signal line 58 and the connector 42.

When the address transistor 16 is in the on state, the electric potential of the output signal line 54 is basically the same as the electric potential of the wire 54*d*. Thus, the wire 54*d* between the address signal line 58 and the connector 42 can reduce the effects of parasitic capacitance, in the same manner as the output signal line 54 disposed between the address signal line 58 and the connector 42. The wire 54*d* electrically connected to the impurity region 22*as* may be disposed between the connector 42 and a wire having a fixed electric potential for a predetermined period when the imaging device 100 operates (for example, the first voltage line 51).

In this way, a node between the signal detection transistor 13 and the address transistor 16 may be electrically coupled to the connector 42. Without the address transistor 16 interposed therebetween, electrical coupling of the connector 42 to the node between the signal detection transistor 13 and the address transistor 16 is more effective than electrical coupling between the output signal line 54 and the connector 42. As described above, the second embodiment of the present disclosure can provide an imaging device in which the decrease in sensitivity resulting from electrical coupling between the connector 42 and a voltage line having a fixed electric potential for a predetermined period during operation can be suppressed in each pixel cell.

Photoelectric Conversion Layer and Principle of Light Detection

A typical example of the structure of the photoelectric conversion layer 12*b* and the principle of light detection will be described below.

The device structures illustrated in FIGS. 13 to 15 are apparently similar to the device structure of a pixel cell in a multilayer image sensor including a photoelectric conversion layer on a semiconductor substrate. In the multilayer image sensor, however, a relatively high bias voltage is applied between a pixel electrode facing one main surface of the photoelectric conversion layer and a transparent electrode facing the other main surface, and positive or negative charge generated by photoelectric conversion is collected as signal charge on the pixel electrode. In contrast, in the imaging device 100 and the photosensor 10, when light is detected, the potential difference (bias) between two main surfaces of the photoelectric conversion layer 12*b* is maintained in a particular range. As described later, when the potential difference between two main surfaces of the photoelectric conversion layer 12*b* is within a predetermined range, there is little charge transfer from the photoelectric conversion layer 12*b* to the electrodes (the pixel electrode 12*a* and the transparent electrode 12*c*) or from the electrodes (the pixel electrode 12*a* and the transparent electrode 12*c*) to the photoelectric conversion layer 12*b*. In the embodiments of the present disclosure, therefore, electric charge generated by photoelectric conversion is not removed from the photoelectric conversion layer 12*b* and remains in the photoelectric conversion layer 12*b*. Holding electric charge generated by photoelectric conversion in the photoelectric conversion layer 12*b* allows a change in illuminance in the photoelectric conversion layer 12*b* to be detected as a change in dielectric constant between the pixel electrode 12*a* and the transparent electrode 12*c*.

Photoelectric Conversion Layer

A typical example of the structure of the photoelectric conversion layer 12*b* will be described in detail below.

The photoelectric conversion layer 12*b* contains a tin naphthalocyanine represented by the following general formula (1) (hereinafter also referred to simply as "tin naphthalocyanine"), for example.

[Chem. 1]

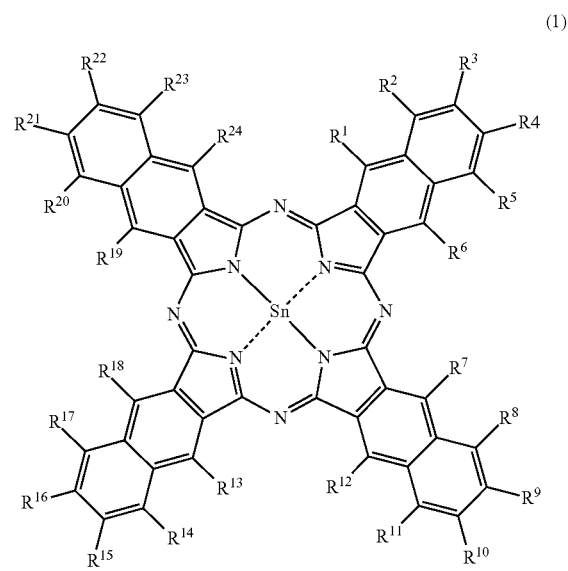

(1)

In the general formula (1), $R^1$ to $R^{24}$ independently denote a hydrogen atom or a substituent. The substituent is not limited to a particular substituent. Examples of the substituent include a deuterium atom, halogen atoms, alkyl groups (including cycloalkyl groups, bicycloalkyl groups, and tricycloalkyl groups), alkenyl groups (including cycloalkenyl groups and bicycloalkenyl groups), alkynyl groups, aryl groups, heterocyclic groups, a cyano group, a hydroxy group, a nitro group, a carboxy group, alkoxy groups, aryloxy groups, silyloxy groups, heterocyclic oxy groups, acyloxy groups, a carbamoyloxy group, alkoxycarbonyloxy groups, aryloxycarbonyloxy groups, amino groups (including anilino groups), ammonio groups, acylamino groups, an aminocarbonylamino group, alkoxycarbonylamino groups, aryloxycarbonylamino groups, a sulfamoylamino group, alkylsulfonylamino groups, arylsulfonylamino groups, a mercapto group, alkylthio groups, arylthio groups, heterocyclic thio groups, a sulfamoyl group, a sulfo group, alkylsulfinyl groups, arylsulfinyl groups, alkylsulfonyl groups, arylsulfonyl groups, acyl groups, aryloxycarbonyl groups, alkoxycarbonyl groups, a carbamoyl group, arylazo groups, heterocyclic azo groups, an imide group, a phosphino group, a phosphinyl group, a phosphinyloxy group, a phosphinylamino group, a phosphono group, a silyl group, a hydrazino group, a ureide group, a boronic acid group (—B(OH)$_2$), a phosphate group (—OPO(OH)$_2$), a sulfate group (—OSO$_3$H), and other known substituents.

The tin naphthalocyanine represented by the general formula (1) may be a commercially available product. Alternatively, the tin naphthalocyanine represented by the general formula (1) may be synthesized using a naphthalene derivative having the following general formula (2) as a starting material, as described in Japanese Unexamined Patent Application Publication No. 2010-232410, for example. In the general formula (2), $R^{25}$ to $R^{30}$ may be the same substituents as $R^1$ to $R^{24}$ of the general formula (1).

[Chem. 2]

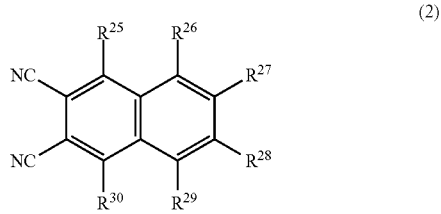

(2)

In the tin naphthalocyanine represented by the general formula (1), in terms of controllability of the aggregation state of molecules, at least 8 of $R^1$ to $R^{24}$ are advantageously a hydrogen or deuterium atom, at least 16 of $R^1$ to $R^{24}$ are more advantageously a hydrogen or deuterium atom, and all of $R^1$ to $R^{24}$ are still more advantageously a hydrogen or deuterium atom. A tin naphthalocyanine represented by the following formula (3) has an advantage in the ease of synthesis.

[Chem. 3]

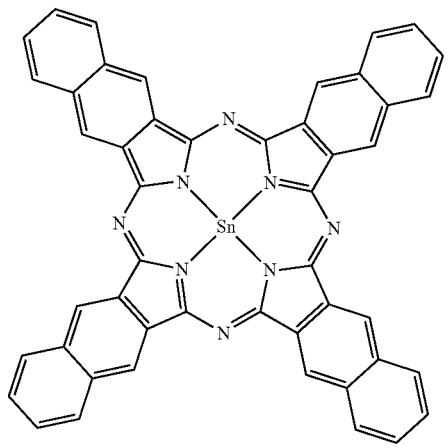

(3)

Figure 16:
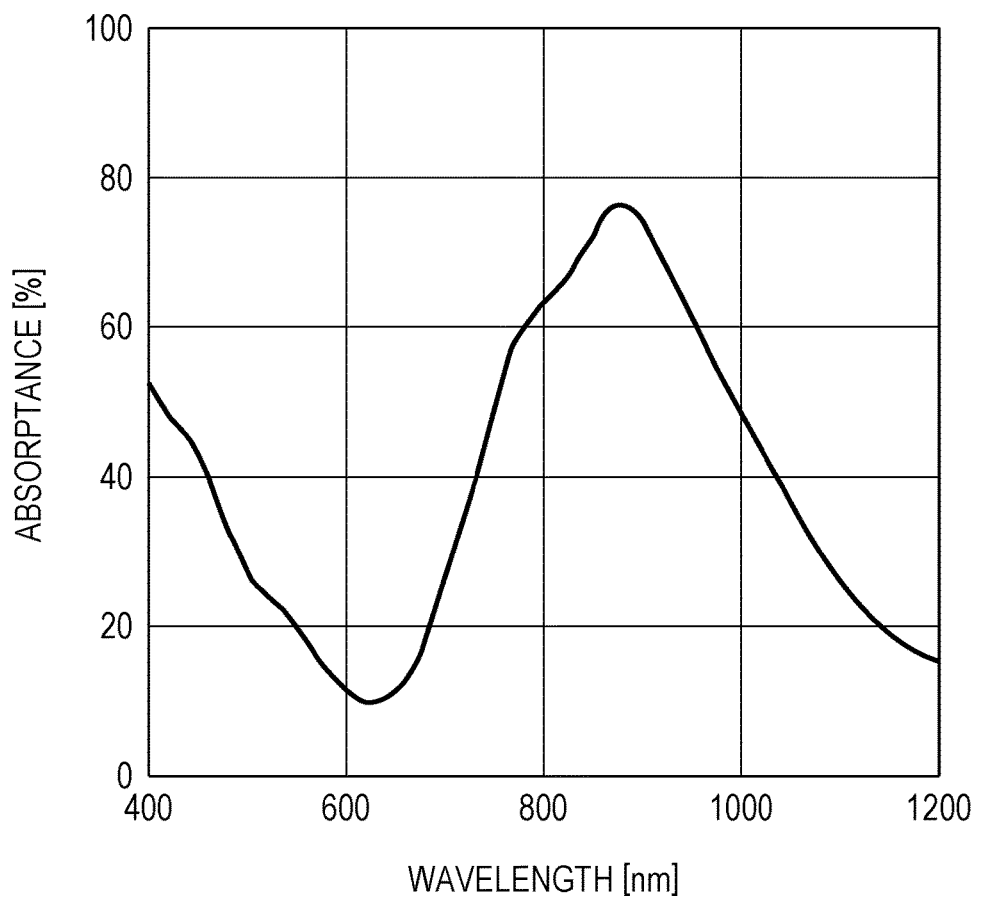
FIG. 16 is an absorption spectrum of a photoelectric conversion layer formed of a material containing tin naphthalocyanine.

The tin naphthalocyanine represented by the general formula (1) has absorption in a wavelength band in the range of approximately 200 to 1100 nm. For example, as illustrated in FIG. 16, the tin naphthalocyanine represented by the formula (3) has an absorption peak at a wavelength of approximately 870 nm. FIG. 16 is an absorption spectrum of a photoelectric conversion layer containing the tin naphthalocyanine represented by the formula (3). In the measurement of the absorption spectrum, a sample that includes a photoelectric conversion layer (thickness: 30 nm) on a quartz substrate is used.

As can be seen from FIG. 16, the photoelectric conversion layer formed of a material containing the tin naphthalocyanine has absorption in the near-infrared region. Thus, a material containing tin naphthalocyanine can be used as a material of the photoelectric conversion layer 12b to provide an imaging device that can detect near-infrared light.

Figure 17:
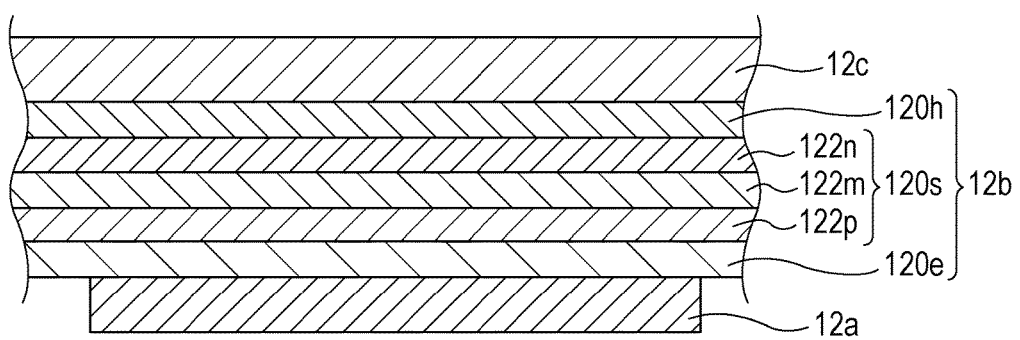
FIG. 17 is a schematic cross-sectional view of a photoelectric conversion layer having a photoelectric conversion structure formed of an organic semiconductor material containing tin naphthalocyanine represented by the general formula (1)

FIG. 17 schematically illustrates a structure of the photoelectric conversion layer 12b. In the structure illustrated in FIG. 17, the photoelectric conversion layer 12b includes a hole blocking layer 120h, a photoelectric conversion structure 120s formed of an organic semiconductor material containing the tin naphthalocyanine represented by the general formula (1), and an electron blocking layer 120e. The hole blocking layer 120h is disposed between the photoelectric conversion structure 120s and the transparent electrode 12c, and the electron blocking layer 120e is disposed between the photoelectric conversion structure 120s and the pixel electrode 12a.

The photoelectric conversion structure 120s illustrated in FIG. 17 contains at least one of a p-type semiconductor and an n-type semiconductor. In the structure illustrated in FIG. 17, the photoelectric conversion structure 120s includes a p-type semiconductor layer 122p, an n-type semiconductor layer 122n, and a mixed layer 122m disposed between the p-type semiconductor layer 122p and the n-type semiconductor layer 122n. The p-type semiconductor layer 122p is disposed between the electron blocking layer 120e and the mixed layer 122m and has a function of photoelectric conversion and/or hole transport. The n-type semiconductor layer 122n is disposed between the hole blocking layer 120h and the mixed layer 122m and has a function of photoelectric conversion and/or electron transport. As described later, the mixed layer 122m may contain at least one of a p-type semiconductor and an n-type semiconductor.

The p-type semiconductor layer 122p and the n-type semiconductor layer 122n contain an organic p-type semiconductor and an organic n-type semiconductor, respectively. Thus, the photoelectric conversion structure 120s contains an organic photoelectric conversion material containing the tin naphthalocyanine represented by the general formula (1) and at least one of the organic p-type semiconductor and the organic n-type semiconductor.

The organic p-type semiconductor (compound) is a donating organic semiconductor (compound), is represented by a hole-transporting organic compound, and refers to an organic compound having electron donating ability. More specifically, the organic p-type semiconductor (compound) refers to an organic compound having a lower ionization potential out of two contacting organic materials. Thus, any electron-donating organic compound can be used as a donating organic compound. Examples of such a donating organic compound include metal complexes including, as ligands, triarylamine compounds, benzidine compounds, pyrazoline compounds, styrylamine compounds, hydrazone compounds, triphenylmethane compounds, carbazole compounds, polysilane compounds, thiophene compounds, such as P3HT, phthalocyanine compounds, such as copper phthalocyanine, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and nitrogen-containing heterocyclic compounds. The donating organic semiconductor is not limited to one of these compounds and may be any organic compound having a lower ionization potential than an organic compound used as an n-type (acceptor) compound, as described above. The tin naphthalocyanine is an organic p-type semiconductor material.

The organic n-type semiconductor (compound) is an accepting organic semiconductor (compound), is represented by an electron-transporting organic compound, and refers to an organic compound having electron accepting ability. More specifically, the organic n-type semiconductor (compound) refers to an organic compound having higher electron affinity out of two contacting organic compounds. Thus, any electron-accepting organic compound can be used as an accepting organic compound. Examples of such an accepting organic compound include metal complexes including, as ligands, fullerene, fullerene derivatives, such as phenyl $C_{61}$ butyric acid methyl ester (PCBM), condensed aromatic carbocyclic compounds (naphthalene derivatives, anthracene derivatives, phenanthrene derivatives, tetracene derivatives, pyrene derivatives, perylene derivatives, and fluoranthene derivatives), 5- to 7-membered heterocyclic compounds containing a nitrogen atom, an oxygen atom, and/or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetraazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, perylenetetracarboxylic diimide compounds (PTCDI), and nitrogen-containing heterocyclic compounds. The accepting organic semiconductor is not limited to one of these and may be any organic compound having higher electron affinity than an organic compound used as a p-type (donating) organic compound, as described above.

The mixed layer 122m may be a bulk heterojunction structure layer containing a p-type semiconductor and an n-type semiconductor. In the case where the mixed layer 122m is a bulk heterojunction structure layer, the tin naphthalocyanine represented by the general formula (1) may be used as a p-type semiconductor material. Fullerene and/or a fullerene derivative may be used as an n-type semiconductor material. A material of the p-type semiconductor layer 122p is advantageously the same as a p-type semiconductor material of the mixed layer 122m. Likewise, a material of the n-type semiconductor layer 122n is advantageously the same as an n-type semiconductor material of the mixed layer 122m. The bulk heterojunction structure is described in detail in Japanese Patent No. 5553727. The content of Japanese Patent No. 5553727 is incorporated herein by reference in its entirety.

Figure 18:
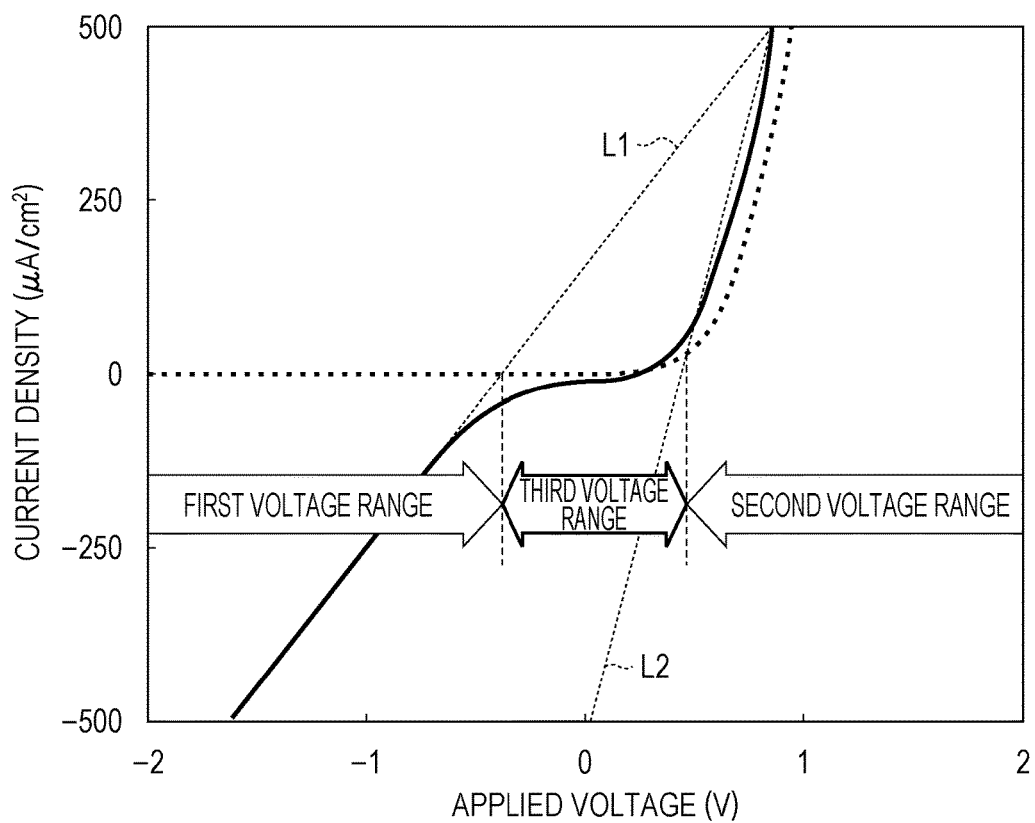
FIG. 18 is a graph illustrating typical photocurrent characteristics of a photoelectric conversion layer.

A material suitable for a wavelength region to be detected can be used to provide an imaging device having high sensitivity in the desired wavelength region. The photoelectric conversion layer 12b may contain an inorganic semiconductor material, such as amorphous silicon. The photoelectric conversion layer 12b may include an organic material layer and an inorganic material layer. In the following description, a bulk heterojunction structure formed by co-deposition of tin naphthalocyanine and $C_{60}$ is used in the photoelectric conversion layer 12b. Photocurrent Characteristics of Photoelectric Conversion Layer FIG. 18 illustrates typical photocurrent characteristics of the photoelectric conversion layer 12b. In FIG. 18, the thick solid line indicates exemplary I-V characteristics of the photoelectric conversion layer 12b under light irradiation. In FIG. 18, I-V characteristics without light irradiation are indicated by the thick broken line.

FIG. 18 illustrates the change in current density between two main surfaces of the photoelectric conversion layer 12b as a function of the change in bias voltage applied between the main surfaces at a certain illuminance. In the present specification, the forward and reverse directions of bias voltage are defined as described below. For a photoelectric conversion layer having a junction structure of a p-type semiconductor layer and an n-type semiconductor layer, the bias voltage at which the electric potential of the p-type semiconductor layer is higher than the electric potential of the n-type semiconductor layer is defined as a forward bias voltage. By contrast, the bias voltage at which the electric potential of the p-type semiconductor layer is lower than the electric potential of the n-type semiconductor layer is defined as reverse bias voltage. The forward and reverse directions in the use of an organic semiconductor material can be defined in the same manner as in the use of an inorganic semiconductor material. In the case where a photoelectric conversion layer has a bulk heterojunction structure, a p-type semiconductor appears in a greater amount than an n-type semiconductor on one of two main surfaces of the photoelectric conversion layer, and the n-type semiconductor appears in a greater amount than the p-type semiconductor on the other surface, as schematically illustrated in FIG. 1 in Japanese Patent No. 5553727. Thus, the bias voltage at which the electric potential on one main surface on which the p-type semiconductor appears in a greater amount than the n-type semiconductor is higher than the electric potential on the other main surface on which the n-type semiconductor appears in a greater amount than the p-type semiconductor is defined as a forward bias voltage.

As illustrated in FIG. 18, the photocurrent characteristics of the photoelectric conversion layer 12b according to an embodiment of the present disclosure is roughly characterized by first to third voltage ranges. The first voltage range is a reverse bias voltage range. In the first voltage range, the absolute output current density increases with reverse bias voltage. In the first voltage range, photocurrent increases with the bias voltage applied between the main surfaces of the photoelectric conversion layer. The second voltage range is a forward bias voltage range. In the second voltage range, the output current density increases with forward bias voltage. In the second voltage range, the forward electric current increases with the bias voltage applied between the main surfaces of the photoelectric conversion layer. The third voltage range is a voltage range between the first voltage range and the second voltage range.

The first to third voltage ranges can be identified by the slope in a graph of photocurrent characteristics with linear vertical and horizontal axes. For reference, in FIG. 18, the average slopes in the first voltage range and the second voltage range are indicated by the broken line L1 and the broken line L2, respectively. As illustrated in FIG. 18, the rate of change in output current density due to an increase in bias voltage varies in the first voltage range, the second voltage range, and the third voltage range. The third voltage range is defined as a voltage range in which the rate of change in output current density with bias voltage is smaller than the rate of change in the first voltage range and the rate of change in the second voltage range. The third voltage range may be determined on the basis of the rising (falling) position in a graph of current-voltage characteristics (I-V characteristics). The third voltage range is typically greater than −1 V and smaller than +1 V. In the third voltage range, the current density between the main surfaces of the photoelectric conversion layer changes little with bias voltage. As illustrated in FIG. 18, the absolute current density in the third voltage range is typically 100 µA/cm² or less.

As described in detail later, in the third voltage range, a hole-electron pair produced by light irradiation recombines and disappears immediately after light irradiation is stopped. Thus, the bias voltage applied between the two main surfaces of the photoelectric conversion layer 12b during operation can be adjusted within the third voltage range to achieve high-speed response. In the third voltage range, a hole-electron pair produced by light irradiation recombines immediately after light irradiation is stopped. Thus, the output of the signal detection transistor 13 is independent of the integrated amount of light and varies with illuminance during light irradiation. Thus, when the potential difference between the two main surfaces of the photoelectric conversion layer 12b is within the third voltage range, the timing of light exposure is basically identical with the timing of signal readout.

In a typical embodiment of the present disclosure, in operation, light is detected while the potential difference between the transparent electrode 12c and one of the two impurity regions of the signal detection transistor 13 coupled to the first voltage line 51 is maintained in the third voltage range. See FIGS. 11 and 13, for example. In the structure described with reference to FIGS. 11 and 13, the bias voltage in the third voltage range based on the impurity region 22ad is supplied from the voltage supply circuit 50 to the transparent electrode 12c. Thus, in light detecting operation, a bias voltage in the third voltage range is applied between the main surface of the photoelectric conversion layer 12b adjacent to the pixel electrode 12a and the main surface of the photoelectric conversion layer 12b adjacent to the transparent electrode 12c. The same is true for the photosensor 10 according to the first embodiment.

Incidence of light on the photoelectric conversion layer 12b produces hole-electron pairs in the photoelectric conversion layer 12b. Since a predetermined bias voltage is applied to the photoelectric conversion layer 12b at this time, dipole moments of the hole-electron pairs are aligned in almost the same direction. Thus, the dielectric constant of the photoelectric conversion layer 12b increases with the production of hole-electron pairs. The electric field strength E in the photoelectric conversion layer 12b to which a predetermined bias voltage is applied under light irradiation satisfies $E=((\sigma_f-\sigma_p)/\epsilon_0)$ and $E=(\epsilon_f/\epsilon)$ according to Gauss' law. $\sigma_f$ denotes the charge density of the electrode (for example, the transparent electrode 12c), and $\sigma_p$ denotes the charge density generated by polarization on a surface of the photoelectric conversion layer 12 facing the electrode. $\epsilon_0$ and $\sigma$ denote the permittivity of free space and the dielectric constant of the photoelectric conversion layer 12b, respectively. $\epsilon=\epsilon_0(\sigma_f/(\sigma_f-\sigma_p))$ is obtained from $E=((\sigma_f-\sigma_p)/\epsilon_0)$ and $E=(\sigma_f/\epsilon)$, indicating that the dielectric constant of the photoelectric conversion layer 12b increases with electric charge (hole-electron pairs) contributing to polarization. Thus, light irradiation on the photoelectric conversion layer 12b increases the dielectric constant between the pixel electrode 12a and the transparent electrode 12c.

Assuming that a combination of the photoelectric converter 12 and the signal detection transistor 13 is one field-effect transistor, an increased dielectric constant between the pixel electrode 12a and the transparent electrode 12c is associated with a decreased threshold voltage in the field-effect transistor (or an increased effective gate voltage in the field-effect transistor). Thus, the voltage of the impurity region 22as changes with the dielectric constant between the pixel electrode 12a and the transparent electrode 12c. In other words, the source voltage in the signal detection transistor 13 changes with illuminance in the pixel cell 20 (or the photosensor 10). Thus, light can be detected by detecting a change in the source voltage with an appropriate detection circuit.

It should be noted that a bias voltage in the third voltage range is applied to the photoelectric conversion layer 12b when light is detected. In known photosensors including a photodiode (or a photoelectric conversion film), light detecting operation is generally performed with a reverse bias corresponding to the first voltage range illustrated in FIG. 18. Thus, holes and electrons produced by photoelectric conversion move toward the cathode and anode of the photodiode, respectively. In light detection with known photosensors including a photodiode (or a photoelectric conversion film), electric charge generated by photoelectric conversion is transferred to an external circuit as a signal.

In contrast, in the imaging device 100 and the photosensor 10 according to the present disclosure, typically, a bias voltage in the third voltage range is applied to the photoelectric conversion layer 12b when light is detected. Light irradiation on the photoelectric conversion layer 12b under a bias voltage in the third voltage range produces hole-electron pairs in the photoelectric conversion layer 12b. Under the bias voltage in the third voltage range, holes and electrons thus produced form dipoles rather than separate and move toward the electrodes. In other words, holes and electrons thus produced are not output from the photoelectric conversion layer 12b.

Charge transfer from or to a photoelectric conversion layer is slow (tens of milliseconds). Thus, in an image sensor involving charge transfer from or to a photoelectric conversion layer, voltage application to or light irradiation on the photoelectric conversion layer at the beginning of image pickup operation may cause noise or produce an after-image. In contrast, a typical embodiment of the present disclosure in which the bias voltage applied to the photoelectric conversion layer 12b during light detection is a voltage in the third voltage range does not involve charge transfer from or to the photoelectric conversion layer 12b and can therefore reduce noise and after-images.

Under a bias voltage in the third voltage range, in the absence of light incident on the photoelectric conversion layer 12b, hole-electron pairs recombine and disappear rapidly (in tens of microseconds). Thus, a typical embodiment of the present disclosure can achieve high-speed response. Due to their high-speed response, the imaging device 100 and the photosensor 10 according to an embodiment of the present disclosure can be advantageously applied to distance measurement utilizing a time-of-flight method or ultrahigh-speed photography.

Although multilayer image sensors can utilize either holes or electrons as signal charge, the imaging device 100 and the photosensor 10 according to an embodiment of the present disclosure can utilize a hole-electron pair for a change in source voltage. Thus, the imaging device 100 and the photosensor 10 can have higher sensitivity. Furthermore, due to the potential difference between the two main surfaces of the photoelectric conversion layer 12b in the third voltage range, a hole-electron pair produced by light irradiation recombines immediately after light irradiation is stopped. Thus, unlike multilayer image sensors, basically, it is not necessary to reset the electric potential of the pixel electrode 12a. The imaging device 100 and the photosensor 10 according to an embodiment of the present disclosure do not accumulate holes or electrons produced in the photoelectric conversion layer 12b as signal charge in floating diffusion. Thus, unlike multilayer image sensors, the semiconductor substrate 22 has no electric charge accumulation region for accumulating signal charge.

Modified Example

When the third voltage range is utilized, the voltage applied between the two main surfaces of the photoelectric conversion layer 12b during light detection is relatively low, for example, approximately 0.1 V. This provides an advantage in that a narrow band-gap material can be easily used as a material of the photoelectric conversion layer 12b. When the third voltage range is utilized, the potential difference between the impurity region 22ad and the transparent electrode 12c is relatively small. Thus, a relatively thin insulating film can be used as the gate-insulating layer 13g, and information on illuminance can be easily acquired as a change in source voltage. However, as described below, a bias voltage in the first voltage range can also be applied to the photoelectric conversion layer 12b to detect light.

Figure 19:
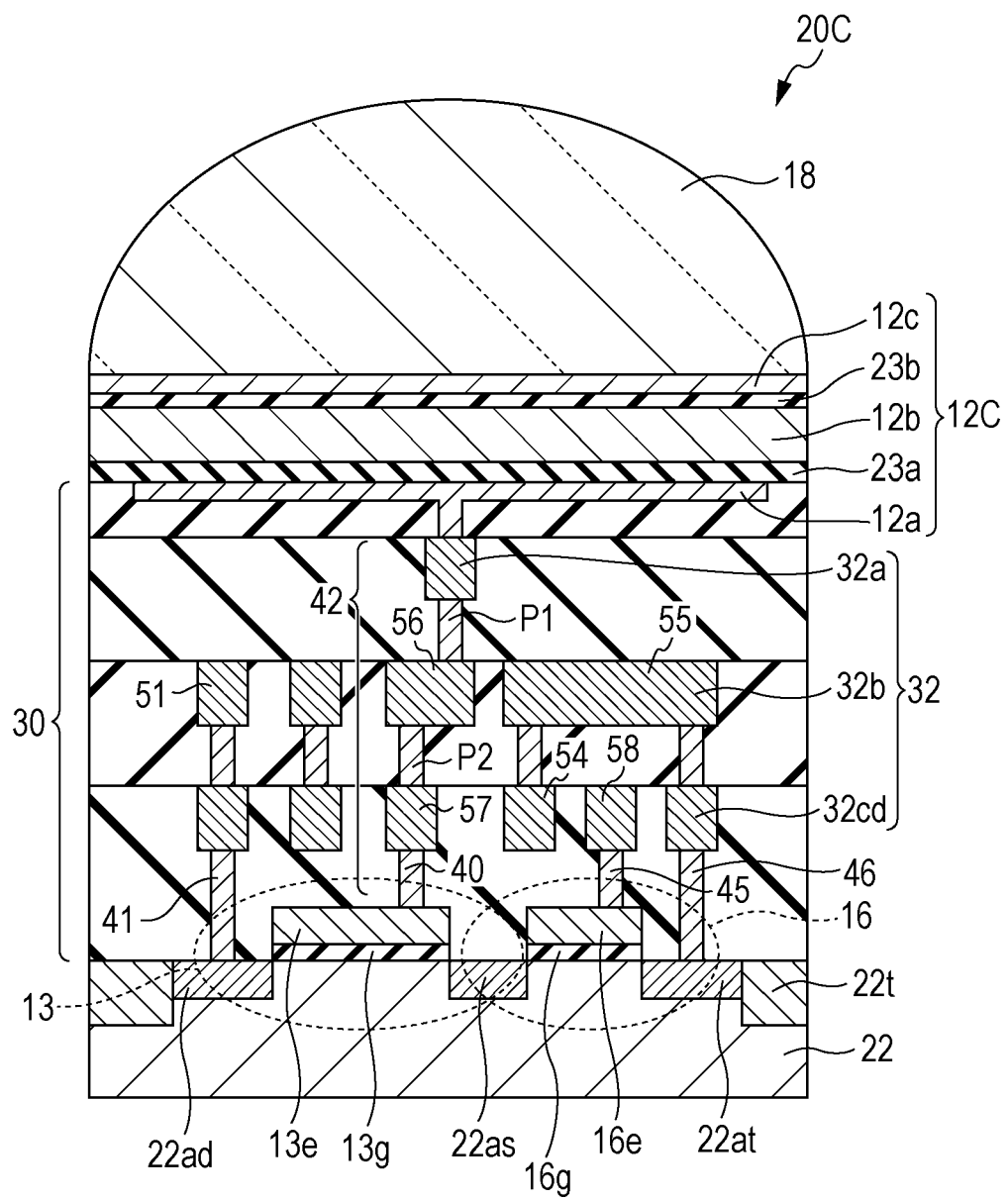
FIG. 19 is a schematic cross-sectional view of a pixel cell of an imaging device according to a modified example.

FIG. 19 illustrates another modified example of the pixel cell. A point of difference between a pixel cell 20C illustrated in FIG. 19 and the pixel cell 20 illustrated in FIG. 13 is that the photoelectric converter 12C of the pixel cell 20C includes an insulating layer between the photoelectric conversion layer 12b and an electrode (the pixel electrode 12a and/or the transparent electrode 12c in the present embodiment). In the structure illustrated in FIG. 19, an insulating layer 23a is disposed between the pixel electrode 12a and the photoelectric conversion layer 12b, and an insulating layer 23b is disposed between the photoelectric conversion layer 12b and the transparent electrode 12c. It will be appreciated by those skilled in the art that the photoelectric converter 12C can be used instead of the photoelectric converter 12 of the photosensor 10 according to the first embodiment.

The material of the insulating layer 23a and the insulating layer 23b can have a smaller leakage current than the material of the photoelectric conversion layer 12b, for example. For example, the insulating layer 23a and the insulating layer 23b may be a silicon oxide film having a thickness of 5.4 nm. The silicon oxide film may be formed by CVD, for example.

In the structure illustrated in FIG. 19, since the insulating layer 23a is disposed between the pixel electrode 12a and the photoelectric conversion layer 12b and the insulating layer 23b is disposed between the photoelectric conversion layer 12b and the transparent electrode 12c, a higher bias voltage can be applied between the drain region (or source region) of the signal detection transistor 13 and the transparent electrode 12c. For example, a first bias voltage of 1.2 V may be applied to the impurity region 22ad, and a second bias voltage of 3.7 V may be applied to the transparent electrode 12c. Thus, the potential difference between the impurity region 22ad and the transparent electrode 12c is approximately 2.5 V.

In the structure illustrated in FIG. 19, the gate-insulating layer 13g, the insulating layer 23a, the insulating layer 23b, and the photoelectric conversion layer 12b individually constitute a capacitor, and therefore the voltage applied between the impurity region 22ad and the transparent electrode 12c is divided into the gate-insulating layer 13g, the insulating layer 23a, the insulating layer 23b, and the photoelectric conversion layer 12b. Thus, practically, the voltage applied to each of the gate-insulating layer 13g, the insulating layer 23a, and the insulating layer 23b is approximately 0.8 V. At an applied voltage of approximately 2.5 V, a silicon oxide film having a thickness of 5.4 nm or more has a sufficiently small leakage current. Thus, even with a potential difference of approximately 2.5 V between the impurity region 22ad and the transparent electrode 12c, the characteristics in the absence of light irradiation can be satisfactorily maintained.

An insulating layer between the photoelectric conversion layer 12b and the electrode(s) (the insulating layers 23a and 23b in the present embodiment) allows a higher bias voltage to be applied between the drain region (or source region) of the signal detection transistor 13 and the transparent electrode 12c. For example, a bias voltage that produces a potential difference in the first voltage range between the two main surfaces of the photoelectric conversion layer 12b may be applied between the drain region (or source region) of the signal detection transistor 13 and the transparent electrode 12c.

Light irradiation on the photoelectric conversion layer 12b while a bias voltage in the first voltage range (see FIG. 18) is applied to the photoelectric conversion layer 12b moves one of holes and electrons generated by photoelectric conversion toward the transparent electrode 12c and the other toward the pixel electrode 12a. Thus, when a bias voltage in the first voltage range is applied to the photoelectric conversion layer 12b, positive and negative charge generated by photoelectric conversion can be separated, and therefore the time to recombination of a hole-electron pair after light irradiation is stopped is longer than that in the case where a bias voltage in the third voltage range is applied to the photoelectric conversion layer 12b. Thus, the timing of light exposure is not necessarily identical with the timing of readout. Since it is relatively easy to perform light exposure and signal readout at different timings, the application of a bias voltage in the first voltage range to the photoelectric conversion layer 12b is in some aspect advantageous when the pixel cell 20C is used in an image sensor.

When a bias voltage in the first voltage range is applied to the photoelectric conversion layer 12b, the insulating layer 23a between the photoelectric conversion layer 12b and the pixel electrode 12a can function as a capacitor for storing holes or electrons generated by photoelectric conversion. Accumulation of electric charge in the capacitor causes electrostatic induction in the connector 42, which couples the pixel electrode 12a and the gate electrode 13e together, and changes the effective gate voltage in the signal detection transistor 13. This changes the source voltage of the signal detection transistor 13. After readout of output signals is completed, for example, a reverse voltage of the second bias voltage is applied to the transparent electrode 12c to reset the charge stored in the insulating layer 23a serving as a capacitor. As a matter of course, light detecting operation may be performed while a bias voltage in the third voltage range is applied to the photoelectric conversion layer 12b. In this case, the reset operation is unnecessary.

An insulating layer may be disposed between the photoelectric conversion layer 12b and the pixel electrode 12a, or between the photoelectric conversion layer 12b and the transparent electrode 12c, or both. Such an insulating layer can prevent charge generated by photoelectric conversion from moving out of the photoelectric conversion layer 12b, even with an increased potential difference between the impurity region 22ad and the transparent electrode 12c. This can reduce after-images. The insulating layer 23a and/or the insulating layer 23b may be a silicon nitride film, an aluminum oxide film, or a high-dielectric-constant film (high-k film (for example, a HfO$_2$ film)), instead of the silicon oxide film.

In these embodiments, the signal detection transistor 13 and the address transistor 16 are N-channel MOSs. However, the transistors in the embodiments of the present disclosure are not limited to N-channel MOSs. The signal detection transistor 13 and the address transistor 16 may be P-channel MOSs. Both the signal detection transistor 13 and the address transistor 16 are not necessarily N-channel MOSs or P-channel MOSs. The address transistor 16 may be a bipolar transistor as well as FET.

The photosensor 10 and the pixel array PA of the imaging device 100 can be manufactured by a typical semiconductor manufacturing process. In particular, when the semiconductor substrate 22 is a silicon substrate, the photosensor 10 and the imaging device 100 can be manufactured by various silicon semiconductor processes.

Camera System

Figure 20:
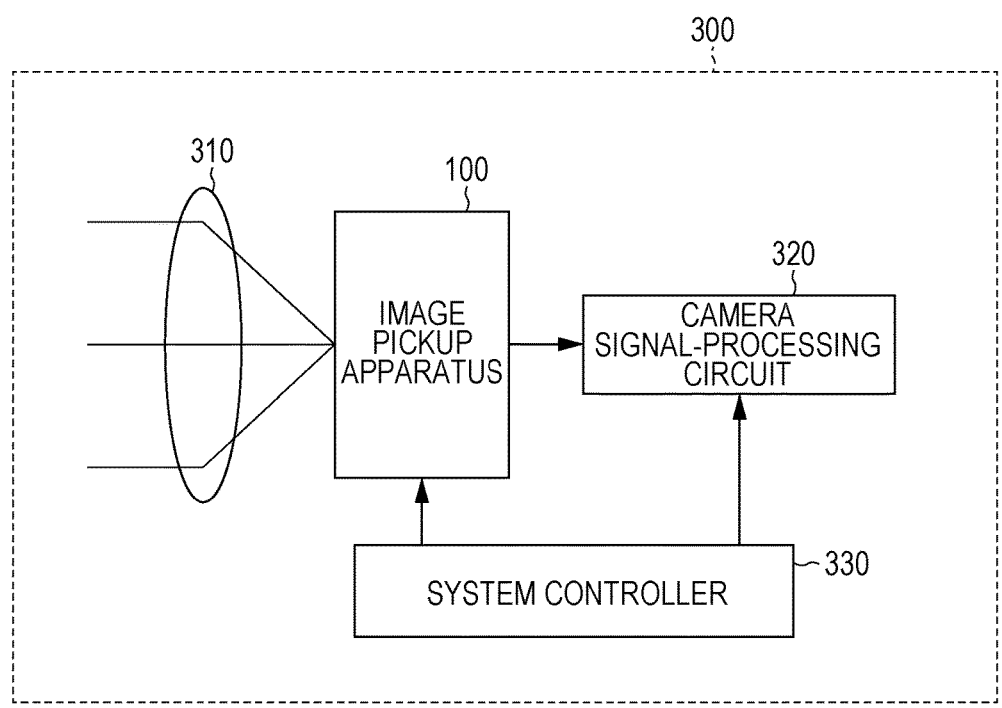
FIG. 20 is a block diagram of an exemplary structure of a camera system.

FIG. 20 schematically illustrates an exemplary structure of a camera system. A camera system 300 illustrated in FIG. 20 includes a lens optical system 310, the imaging device 100, a system controller 330, and a camera signal-processing circuit 320. The camera system 300 can include an input interface including various buttons and a touch screen for receiving input from a user.

The lens optical system 310 includes an autofocus lens, a zoom lens, and an aperture, for example. The lens optical system 310 condenses light to an imaging plane of the imaging device 100. In the case where the photoelectric conversion layer 12b is formed of a material having absorption in the visible light region, a color filter can be disposed on the imaging plane of the imaging device 100.

The system controller 330 controls the camera system 300. The system controller 330 may be a microcontroller, for example. The system controller 330 may include at least one memory. The system controller 330 controls driving in the vertical scanning circuit 60 and the voltage supply circuit 50, for example.

The camera signal-processing circuit 320 functions as a signal-processing circuit for processing output signals sent from the imaging device 100. The camera signal-processing circuit 320 performs gamma correction, color interpolation processing, space interpolation processing, and auto white balance, for example. The camera signal-processing circuit 320 may include a digital signal processor (DSP), an image signal processor (ISP), and/or a field-programmable gate array (FPGA), for example. The camera signal-processing circuit 320 may include at least one memory.

At least one of the system controller 330 and the camera signal-processing circuit 320 may be disposed on the semiconductor substrate 22 on which a pixel cell (for example, the pixel cell 20 described with reference to FIG. 13) is disposed. The imaging device 100 and at least one of the system controller 330 and the camera signal-processing circuit 320 can be manufactured as a single semiconductor device to decrease the size of the camera system 300.

A photosensor and an imaging device according to the present disclosure are applicable to photodetectors and image sensors. The material of the photoelectric conversion layer can be appropriately selected to capture images using infrared light. An imaging device that utilizes infrared light to take images can be used in security cameras and cameras installed in vehicles, for example. Cameras installed in vehicles can be used as input for controllers in order for safe driving, for example. Cameras installed in vehicles can be used to assist the operator for safe driving.

What is claimed is:

1. A photosensor comprising:
   a photoelectric converter including a first electrode, a second electrode facing the first electrode, and a photoelectric conversion layer between the first electrode and the second electrode;
   a first transistor having a first gate, a first source and a first drain;
   a connector electrically connecting the first electrode and the first gate together;
   one or more wiring layers between the first transistor and the photoelectric converter, the one or more wiring layers including a part of the connector,
   a first voltage supply circuit that supplies a first fixed voltage, and
   a first controller, wherein
   the first transistor outputs an electric signal from one of the first source and the first drain, the electric signal corresponding to a change in dielectric constant between the first electrode and the second electrode, the change being caused by incident light on the photoelectric conversion layer,
   the one or more wiring layers include a first line and a second line, the first line being coupled to the one of the first source and the first drain,
   the first controller causes the first voltage supply circuit to supply the first fixed voltage to the second line in a first period during operation, and
   a distance between the first line and the connector is less than a distance between the second line and the connector.

2. The photosensor according to claim 1, wherein the second line is coupled to the other of the first source and the first drain.

3. The photosensor according to claim 1, further comprising
   a second transistor having a second gate, a second source and a second drain, one of the second source and the second drain being coupled to the one of the first source and the first drain, the other of the second source and the second drain being coupled to the first line, wherein
   the first line is coupled to the one of the first source and the first drain via the second transistor.

4. The photosensor according to claim 3, wherein the second line is coupled to the other of the first source and the first drain.

5. The photosensor according to claim 4, comprising
   a second voltage supply circuit that supplies a second fixed voltage, and
   a second controller, wherein
   the one or more wiring layers further include a third line,
   the second controller causes the second voltage supply circuit to supply the second fixed voltage to the third line in a second period during operation,
   the third line is coupled to the second gate, and
   a distance between the first line and the connector is less than a distance between the third line and the connector.

6. The photosensor according to claim 5, wherein the first line is between the part of the connector and the third line.

7. The photosensor according to claim 3, wherein the second line is coupled to the second gate.

8. The photosensor according to claim 1, further comprising
   a second transistor having a second gate, a second source and a second drain, one of the second source and the second drain being coupled to the one of the first source and the first drain, wherein the first line is coupled to the one of the second source and the second drain, and the second line is coupled to the second gate.

9. The photosensor according to claim 1, further comprising a second transistor having a second gate, a second source and a second drain, one of the second source and the second drain being coupled to the other of the first source and the first drain.

10. The photosensor according to claim 8, wherein the second line is coupled to the other of the second source and the second drain.

11. The photosensor according to claim 10, comprising a second voltage supply circuit that supplies a second fixed voltage, and a second controller, wherein the one or more wiring layers further include a third line, the second controller causes the second voltage supply circuit to supply the second fixed voltage to the third line in a second period during operation, the third line is coupled to the second gate, and a distance between the first line and the connector is less than a distance between the third line and the connector.

12. The photosensor according to claim 8, wherein the second line is coupled to the second gate.

13. The photosensor according to claim 1, wherein the first line is between the part of the connector and the second line.

14. The photosensor according to claim 1, wherein the first line surrounds the part of the connector in a plan view.

15. The photosensor according to claim 1, comprising a second voltage supply circuit, wherein the photoelectric conversion layer has a photocurrent characteristic between a bias voltage and an output current density, the photocurrent characteristic including a first voltage range where an absolute value of the output current density increases as the bias voltage increases in a reverse direction, a second voltage range where the output current density increases as the bias voltage increases in a forward direction, and a third voltage range where an absolute value of a change rate of the output current density relative to the bias voltage is less than in the first voltage range and the second voltage range, the third voltage range being a voltage range between the first voltage range and the second voltage range, and the first transistor outputs the electric signal in a state where the second voltage supply circuit applies a first bias voltage within the third voltage range to the photoelectric conversion layer.

16. The imaging device according to claim 15, comprising a second controller that causes the second voltage supply circuit to supply the first bias voltage.

17. An imaging device comprising a plurality of pixel cells each including the photosensor according to claim 1, wherein the plurality of pixel cells are arranged one-dimensionally or two-dimensionally.

* * * * *